(12) United States Patent
Wang et al.

(10) Patent No.: US 12,188,146 B2
(45) Date of Patent: Jan. 7, 2025

(54) METHODS AND SYSTEMS FOR CONTROLLING CRYSTAL GROWTH

(71) Applicant: MEISHAN BOYA ADVANCED MATERIALS CO., LTD., Sichuan (CN)

(72) Inventors: Yu Wang, Meishan (CN); Weiming Guan, Meishan (CN); Zhenxing Liang, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 749 days.

(21) Appl. No.: 17/227,256

(22) Filed: Apr. 9, 2021

(65) Prior Publication Data
US 2022/0220630 A1  Jul. 14, 2022

Related U.S. Application Data

(63) Continuation of application No. PCT/CN2021/071114, filed on Jan. 11, 2021.

(51) Int. Cl.
*C30B 15/20* (2006.01)
*C30B 15/26* (2006.01)
(Continued)

(52) U.S. Cl.
CPC ............ *C30B 15/20* (2013.01); *C30B 15/26* (2013.01); *C30B 15/28* (2013.01); *C30B 35/00* (2013.01); *G05B 15/02* (2013.01)

(58) Field of Classification Search
CPC ......... C30B 15/26; C30B 15/20; C30B 15/28; C30B 35/00
See application file for complete search history.

(56) References Cited

U.S. PATENT DOCUMENTS 3,761,692 A * 9/1973 Cope .................. C30B 15/22
                                                        700/207
5,246,535 A * 9/1993 Kawashima ........... G01B 11/08
                                                         117/15
(Continued)

FOREIGN PATENT DOCUMENTS

CN      1330798 C     8/2007
CN    101591802 A    12/2009
(Continued)

OTHER PUBLICATIONS

The Third Office Action in Chinese Application No. 202180000165.7 mailed on Dec. 8, 2021, 23 pages.
(Continued)

*Primary Examiner* — Matthew J Song
(74) *Attorney, Agent, or Firm* — METIS IP LLC

(57) ABSTRACT

The embodiments of the present disclosure disclose a method for controlling crystal growth. The method includes: obtaining an actual crystal parameter in a target time slice; obtaining a reference crystal parameter in the target time slice; determining a temperature control parameter based on the actual crystal parameter and the reference crystal parameter; determining a pulling control parameter based on the actual crystal parameter and the reference crystal parameter; and adjusting a temperature and a pulling speed in a next time slice after the target time slice respectively based on the temperature control parameter and the pulling control parameter.

18 Claims, 19 Drawing Sheets

(51) Int. Cl.
  *C30B 15/28* (2006.01)
  *C30B 35/00* (2006.01)
  *G05B 15/02* (2006.01)

(56) References Cited

U.S. PATENT DOCUMENTS

| | | | |
|---|---|---|---|
| 5,800,612 | A | 9/1998 | Shimomura et al. |
| 6,776,840 | B1 | 8/2004 | Fuerhoff et al. |
| 2002/0043206 | A1* | 4/2002 | Mutti .................. C30B 15/22 117/14 |
| 2006/0005761 | A1* | 1/2006 | Kulkarni ............... C30B 15/22 117/14 |
| 2010/0242625 | A1* | 9/2010 | Korb .................... G01G 19/18 73/862.42 |
| 2010/0263585 | A1* | 10/2010 | Hamada ............... C30B 15/26 117/15 |
| 2012/0186512 | A1 | 7/2012 | Orschel et al. |
| 2019/0330760 | A1 | 10/2019 | Suewaka |
| 2020/0255972 | A1 | 8/2020 | Deng |
| 2020/0291541 | A1 | 9/2020 | Deng |
| 2020/0340137 | A1* | 10/2020 | Huang ................... C30B 29/06 |

FOREIGN PATENT DOCUMENTS

| | | |
|---|---|---|
| CN | 102534757 A | 7/2012 |
| CN | 104651926 A | 5/2015 |
| CN | 105717878 A | 6/2016 |
| CN | 105839176 A | 8/2016 |
| CN | 106283178 A | 1/2017 |
| CN | 104911697 B | 10/2017 |
| CN | 108624952 A | 10/2018 |
| CN | 108754599 A | 11/2018 |
| CN | 109234795 A | 1/2019 |
| CN | 110067019 A | 7/2019 |
| CN | 112323141 A | 2/2021 |
| JP | 2003192487 A | 7/2003 |

OTHER PUBLICATIONS

Zeng, Fanming, Neodymium-Doped Ytterbium Gadolinium Gallium Garnet Laser Crystal, Jilin University Press, 15 pages.

Wang, Haibo, Implemention of Automatic Growth Control of Sapphire by Heat-Exchange Method Based on PLC, Mechanical and Electrical Information, 2018, 4 pages.

Xu, Jun, Frontiers of Laser Materials Science and Technology, Shanghai Jiaotong University Press, 2007, 11 pages.

The Extended European Search Report in European Application No. 21721809.8 mailed on Jun. 2, 2022, 8 pages.

International Search Report in PCT/CN2021/071114 mailed on Jul. 30, 2021, 4 pages.

Written Opinion in PCT/CN2021/071114 mailed on Jul. 30, 2021, 4 pages.

First Office Action in Chinese Application No. 202180000165.7 mailed on Jul. 16, 2021, 16 pages.

* cited by examiner

600

Real-time curve   Intermediate frequency power setting   Geometric parameter setting   Control parameter input
Single crystal furnace manual control   Parameter selection   Historical curve   Record query   Weight calibration
Other setting   Graphic display

Geometric Parameter Setting

Crystal Number: 2e

Physical Properties

| Stage | Height (mm) | Diameter (mm) |
|---|---|---|
| Seed Crystal | ? | |
| Shoulder | ? | ? |
| Equal Diameter 1 | ? | ? |
| Equal Diameter 2 | ? | |
| Equal Diameter 3 | ? | |
| Equal Diameter 4 | ? | ? |
| Tail | ? | |
| Crystal Tail | ? | |
| R1/R2 | ? / ? | |
| Shoulder Angel | ? | |
| Tail Angel | ? | |

Solid Density: ?
Liquid Density: ?
Diameter of Crucible: ?

Computation Result

Theoretical Quality: 2990.5999
Theoretical Pulling Height: 301.31620
Theoretical Drop Height of Liquid Level: 53.017124
Theoretical Crystal Length: 354.33333

[Confirm Geometric Parameter]   [Cancel]   [Update Shape]

FIG. 6

| Control Parameter Input | | | | | Control parameter input | |
|---|---|---|---|---|---|---|
| Stage | Height (mm) | Growth Speed (mm/h) | Rotation Speed (mm) | Proportional Term (P) | Integral Term (I) |
| Seed Crystal | 0 | 0 | | | 0 |
| Shoulder 1 | 0 | 0 | 0 | 0 | 0 |
| Shoulder 2 | 0 | 0 | 0 | 0 | 0 |
| Shoulder 3 | 0 | 0 | 0 | 0 | 0 |
| Equal Diameter 1 | 0 | 0 | 0 | 0 | 0 |
| Equal Diameter 2 | 0 | 0 | 0 | 0 | 0 |
| Equal Diameter 3 | 0 | 0 | 0 | 0 | 0 |
| Equal Diameter 4 | 0 | 0 | 0 | 0 | 0 |
| Tail 1 | 0 | 0 | 0 | 0 | 0 |
| Tail 2 | 0 | 0 | 0 | 0 | 0 |
| Tail 3 | 0 | 0 | 0 | 0 | 0 |
| Crystal Tail | 0 | 0 | | | 0 |

Real-time curve  Intermediate frequency power setting  Geometric parameter setting  Control parameter setting
Single crystal furnace manual control  Parameter selection  Historical curve  Record query  Weight calibration
Other setting  Graphic display

| Determining a drop speed of a liquid level in a target time slice based on an actual crystal mass, a melting density of a raw material, and a size of a chamber, | ~ 901 |

↓

| Determining a pulling control parameter based on the drop speed of the liquid level and a reference crystal growth parameter | ~ 902 |

Option

Information Board

Current Position (mm): 207.453

Growth Information
Crystal Number: lyso-20-yj13-1a-f02bl
Growth Stage: Shoulder 2
Theoretical Growth Speed: 23.25
Actual Growth Speed: 21.58
Difference of Growth Speed: 1.67

Information of Current Process
Total Weight of Weighing: 729.47
Net Weight of Crystal: 162.57
Computed Diameter: 45.84
Crystal Length: 37.93
Drop Height of Liquid Level: 2.11

IF Information
Busbar Voltage: 555.00
IF Current: 182.57
Current Power: 27882.00
Current Rotation Speed: 2.00
Current Pulling Speed: 1.555
P: 0.20000
I: 5.00000
Maximum Power Limit: 28000
Minimum Power Limit: 600

Water Temperature
Water Inlet Temperature °C: 28000
Water Outlet Temperature °C: 600

Start Growth    Stop Growth

Real-time curve  Intermediate frequency power setting  Geometric parameter setting  Control parameter input
Single crystal furnace manual control  Parameter selection  Historical curve  Record query  Weight calibration
Other setting  Graphic display Diameter Curve ◇ Theoretical Diameter     ● Actual Diameter Diameter comparison diagram Update    Determine

Other state
IF power communication connection    True
PCL communication connection          False
HBM1 communication connection         Ture
HBM2 communication connection         Ture

Alarm
Temperature of outlet water is too high!!

Cancel Alarm

METHODS AND SYSTEMS FOR CONTROLLING CRYSTAL GROWTH

CROSS-REFERENCE TO RELATED APPLICATIONS

This application is a Continuation of International Application No. PCT/CN2021/071114, filed on Jan. 11, 2021, the entire contents of which are hereby incorporated by reference.

TECHNICAL FIELD

The present disclosure generally relates to the technical field of crystal preparation, and in particular, to methods and systems for controlling crystal growth.

BACKGROUND

In a process of crystal preparation, a process condition and a control parameter may determine a quality of crystal to be prepared to a certain extent. Further, the quality of the crystal may also affect a performance of a device prepared using the crystal. If it is desired to prepare a crystal with a high-quality, various process conditions and control parameters in the crystal growth need to be accurately controlled during the process of crystal preparation. Therefore, it is desirable to provide methods and systems for controlling crystal growth to achieve accurate and efficient control of the crystal growth process.

SUMMARY

One embodiment of the present disclosure provides a method for controlling crystal growth. The method may include obtaining an actual crystal parameter in a target time slice, wherein the actual crystal parameter may include at least one of an actual crystal mass, an actual crystal diameter, an actual crystal height, or an actual crystal shape. The method may include obtaining a reference crystal parameter in the target time slice, wherein the reference crystal parameter may include at least one of a reference crystal mass, a reference crystal diameter, a reference crystal height, or a reference crystal shape. The method may also include determining a temperature control parameter based on the actual crystal parameter and the reference crystal parameter. The method may include determining a pulling control parameter based on the actual crystal parameter and the reference crystal parameter. The method may further include adjusting a temperature and a pulling speed in a next time slice after the target time slice respectively based on the temperature control parameter and the pulling control parameter.

In some embodiments, the obtaining an actual crystal parameter in a target time slice may include: determining a drop height of a liquid level in the target time slice, based on the actual crystal mass, a density of a raw material under a molten state, and a size of a chamber; determining the actual crystal height based on a pulling height and the drop height of the liquid level in the target time slice; and determining the actual crystal diameter based on the actual crystal mass and the actual crystal height.

In some embodiments, the obtaining a reference crystal parameter in the target time slice may include: constructing a crystal growth model based on at least one of a preset crystal parameter or a preset crystal growth parameter; and determining, based on the crystal growth model, the reference crystal parameter corresponding to the target time slice.

In some embodiments, the preset crystal parameter may include at least one of a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, or a ratio of a transition angle between the seed crystal and a shoulder front end to a transition angle between a shoulder end and a front end at the equal diameter.

In some embodiments, the preset crystal growth parameter may include at least one of a preset crystal growth speed or a preset growth coefficient.

In some embodiments, the constructing a crystal growth model based on the preset crystal parameter may include: constructing the crystal growth model based on the preset crystal parameter according to a three-dimensional modeling manner.

In some embodiments, the determining a temperature control parameter based on the actual crystal parameter and the reference crystal parameter may include: determining a difference between the actual crystal parameter and the reference crystal parameter; and determining the temperature control parameter based on the difference and a reference crystal growth parameter.

In some embodiments, the determining a pulling control parameter based on the actual crystal parameter and the reference crystal parameter may include: determining a drop speed of a liquid level in the target time slice based on the actual crystal mass, a melting density of a raw material, and a size of a chamber; and determining the pulling control parameter based on the drop speed of the liquid level and a reference crystal growth parameter.

In some embodiments, before the obtaining an actual crystal parameter in a target time slice, the method may further include: heating a chamber to a preset temperature; and in response to detecting that a temperature in the chamber is stable at the preset temperature for a preset time, automatically dropping a seed crystal.

In some embodiments, the method may further include: continuously detecting a weight of the seed crystal during a process of automatically dropping the seed crystal; and if the weight of the seed crystal is less than a preset weight threshold, stop dropping the seed crystal and providing a prompt.

In some embodiments, the method may further include: obtaining a real-time image during the process of dropping the seed crystal; comparing the real-time image with a preset reference image; and determining whether to adjust a heating parameter based on a comparison result.

In some embodiments, the method may further include: after the crystal growth is completed, performing an automatic ending operation by controlling the temperature control parameter or the pulling control parameter.

In some embodiments, the method may further include: continuously detecting a crystal weight during the process of automatic ending operation; and if the crystal weight is greater than a preset weight threshold, providing a prompt and controlling a pulling component to move in a reverse direction.

One embodiment of the present disclosure provides a system for controlling crystal growth applied to a crystal preparation process. The system may include at least one storage storing computer instructions; and at least one processor in communication with the at least one storage. When executing the computer instructions, the at least one processor is configured to cause the system to: obtain an actual crystal parameter in a target time slice, wherein the actual crystal parameter may include at least one of an actual crystal mass, an actual crystal diameter, an actual crystal height, or an actual crystal shape; obtain a reference crystal parameter in the target time slice, wherein the reference crystal parameter may include at least one of a reference crystal mass, a reference crystal diameter, a reference crystal height, or a reference crystal shape; determine a temperature control parameter based on the actual crystal parameter and the reference crystal parameter; determine a pulling control parameter based on the actual crystal parameter and the reference crystal parameter; adjust a temperature and a pulling speed in a next time slice after the target time slice respectively based on the temperature control parameter and the pulling control parameter.

In some embodiments, to obtain an actual crystal parameter in a target time slice, the at least one processor may cause the system to: determine a drop height of a liquid level in the target time slice based on the actual crystal mass, a density of a raw material under a molten state, and a size of a chamber; determine the actual crystal height based on a pulling height and the drop height of the liquid level in the target time slice; and determine the actual crystal diameter based on the actual crystal mass and the actual crystal height.

In some embodiments, to obtain a reference crystal parameter in the target time slice, the at least one processor may cause the system to: construct a crystal growth model based on at least one of a preset crystal parameter or a preset crystal growth parameter; and determine, based on the crystal growth model, the reference crystal parameter corresponding to the target time slice.

In some embodiments, the preset crystal parameter may include at least one of a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, or a ratio of a transition angle between the seed crystal and a shoulder front end to a transition angle between a shoulder end and a front end at the equal diameter.

In some embodiments, the preset crystal growth parameter may include at least one of a preset crystal growth speed or a preset growth coefficient.

In some embodiments, to construct a crystal growth model based on the preset crystal parameter, the at least one processor may cause the system to construct the crystal growth model based on the preset crystal parameter according to a three-dimensional modeling manner.

In some embodiments, to determine a temperature control parameter based on the actual crystal parameter and the reference crystal parameter, the at least one processor may cause the system to: determine a difference between the actual crystal parameter and the reference crystal parameter; and determine the temperature control parameter based on the difference and the reference crystal growth parameter.

In some embodiments, to determine a pulling control parameter based on the actual crystal parameter and the reference crystal parameter, the at least one processor may cause the system to: determine a drop speed of a liquid level in the target time slice based on the actual crystal mass, a melting density of a raw material, and a size of a chamber; and determine the pulling control parameter based on the drop speed of the liquid level and a reference crystal growth parameter.

In some embodiments, before the obtaining an actual crystal parameter in a target time slice, the at least one processor may cause the system to: heat a chamber to a preset temperature; and in response to detecting that a temperature in the chamber is stable at the preset temperature for a preset time, automatically drop the seed crystal.

In some embodiments, the at least one processor may cause the system to: continuously detect a weight of the seed crystal during a process of automatically dropping the seed crystal; and if the weight of the seed crystal is less than a preset weight threshold, stop dropping the seed crystal and provide a prompt.

In some embodiments, the at least one processor may cause the system to: obtain a real-time image during the process of dropping the seed crystal; compare the real-time image with a preset reference image; and determine whether to adjust a heating parameter based on a comparison result.

In some embodiments, the at least one processor may cause the system to: after the crystal growth is completed, perform an automatic ending operation by controlling the temperature control parameter or the pulling control parameter.

In some embodiments, the at least one processor may cause the system to: continuously detect a crystal weight during the process of automatic ending operation; and if the crystal weight is greater than a preset weight threshold, provide a prompt and control a pulling component to move in a reverse direction.

One embodiment of the present disclosure provides a system for controlling crystal growth applied to a crystal preparation process. The system may include an obtaining module, configured to obtain an actual crystal parameter in a target time slice, wherein the actual crystal parameter may include at least one of an actual crystal mass, an actual crystal diameter, an actual crystal height, or an actual crystal shape; and obtain a reference crystal parameter in the target time slice, wherein the reference crystal parameter may include at least one of a reference crystal mass, a reference crystal diameter, a reference crystal height, or a reference crystal shape; a determination module, configured to determine a temperature control parameter based on the actual crystal parameter and the reference crystal parameter; and determine a pulling control parameter based on the actual crystal parameter and the reference crystal parameter; and a control module, configured to adjust a temperature and a pulling speed in a next time slice after the target time slice respectively based on the temperature control parameter and the pulling control parameter.

One embodiment of the present disclosure provides a computer-readable storage medium, the storage medium may store computer instructions. When executed by at least one processor, the instructions may cause the at least one processor to perform following operations: obtaining an actual crystal parameter in a target time slice, wherein the actual crystal parameter may include at least one of an actual crystal mass, an actual crystal diameter, an actual crystal height, or an actual crystal shape; obtaining a reference crystal parameter in the target time slice, wherein the reference crystal parameter may include at least one of a reference crystal mass, a reference crystal diameter, a reference crystal height, or a reference crystal shape; determining a temperature control parameter based on the actual crystal parameter and the reference crystal parameter; determining a pulling control parameter based on the actual crystal parameter and the reference crystal parameter; adjusting a temperature and a pulling speed in a next time slice after the target time slice respectively based on the temperature control parameter and the pulling control parameter.

BRIEF DESCRIPTION OF THE DRAWINGS

FIG. 6 is an exemplary interface for determining a preset crystal parameter according to some embodiments of the present disclosure;

FIG. 7 is an exemplary interface for determining a preset crystal growth parameter according to some embodiments of the present disclosure;

FIG. 9 is a flowchart illustrating an exemplary process for determining a pulling control parameter according to some embodiments of the present disclosure;

FIG. 10 is a diagram illustrating a comparison between an actual crystal diameter and a reference crystal diameter according to some embodiments of the present disclosure;

FIG. 16 is an exemplary operation interface for a parameter selection according to some embodiments of the present disclosure;

DETAILED DESCRIPTION

Figure 1:
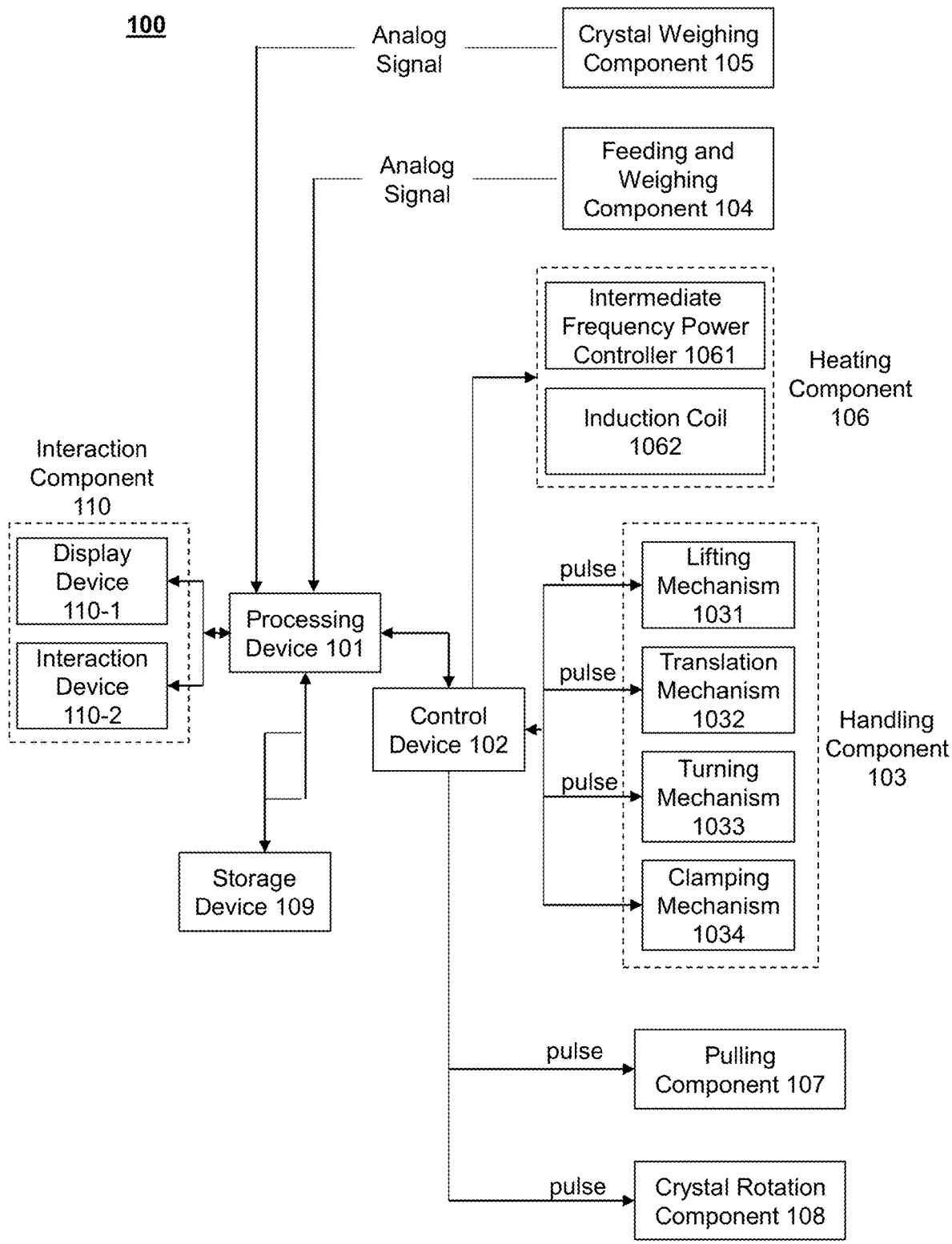
FIG. 1 is a schematic diagram illustrating an exemplary crystal growth control system according to some embodiments of the present disclosure.

In order to illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless apparent from the locale or otherwise stated, like reference numerals represent similar structures or operations in the drawings.

It will be understood that the terms "system," "device," "unit," and/or "module" used herein are one method to distinguish different components, elements, parts, sections or assemblies of different levels. However, if other words may achieve the same purpose, the words may be replaced by other expressions.

As used in the disclosure and the appended claims, the singular forms "a," "an," and "the" include plural referents unless the content clearly dictates otherwise. In general, the terms "comprise" and "include" merely prompt to include operations and elements that have been clearly identified, and these operations and elements do not constitute an exclusive listing. The methods or devices may also include other operations or elements.

In the present disclosure, a flowchart is used to explain the operations performed by the system according to the embodiment of the present disclosure. It should be understood that the preceding or following operations are not necessarily performed exactly in order. Instead, the operations may be processed in reverse order or simultaneously. At the same time, other operations may be also added to these processes. Alternatively, one operation or several operations may be removed from these processes.

FIG. 1 is a schematic diagram illustrating an exemplary crystal growth control system according to some embodiments of the present disclosure.

In some embodiments, the crystal growth control system 100 may be applied to a growth control of various crystals (e.g., a scintillation crystal (e.g., yttrium lutetium silicate (LYSO), bismuth germanate (BGO)), a spinel crystal) during a growth process. In some embodiments, as shown in FIG. 1, the crystal growth control system 100 may include a processing device 101, a control device 102, a handling component 103, a feeding and weighing component 104, a crystal weighing component 105, a heating component 106, a pulling component 107, a crystal rotation component 108, a storage device 109, and an interaction component 110.

The processing device 101 may be used to process various types of data and/or information involved in the crystal growth process. In some embodiments, the processing device 101 may obtain an actual crystal parameter (e.g., an actual crystal mass, an actual crystal diameter, an actual crystal height, an actual crystal shape) and a reference crystal parameter (e.g., a reference crystal mass, a reference crystal diameter, a reference crystal height, a reference crystal shape), and generate a control instruction (e.g., a control instruction including a temperature control parameter, a pulling control parameter, and/or a crystal rotation control parameter, a feeding control instruction) based on obtained data. The processing device 101 may also transmit the control instruction to the control device 102. The control device 102 may control the pulling component 107, the heating component 106, the crystal rotation component 108, the handling component 103, etc. based on the control instruction. In some embodiments, the processing device 101 may include an industrial control computer. In some embodiments, the processing device 101 may be used as an upper-level control and monitoring device or an upper-level processing device.

The control device 102 may be used to control various operations (e.g., a temperature adjustment, a pulling speed adjustment, a crystal rotation speed adjustment, a feeding operation) involved in the crystal growth process. In some embodiments, the control device 102 may receive the control instruction from the processing device 101 and control the crystal growth process based on the control instruction. In some embodiments, the control device 102 may include a programmable logic controller (PLC). In some embodiments, the control device 102 may be used as a lower-level real-time control device.

In some embodiments, the processing device 101 and/or the control device 102 may include a central processing unit (CPU), an application specific integrated circuit (ASIC), an application specific instruction set processor (ASIP), an image processing unit (GPU), a physical operation processing unit (PPU), a digital signal processor (DSP), a field programmable gate array (FPGA), a programmable logic device (PLD), controller, a microcontroller unit, a reduced instruction set computer (RISC), a microprocessor, or the like, or any combination thereof. In some embodiments, the processing device 101 and the control device 102 may be integrated into a single device. In some embodiments, the control device 102 may be a portion of the processing device 101. In some embodiments, functions of the processing device 101 and functions of the control device 102 may be shared with each other or completed together.

The crystal weighing component 105 may be used to monitor an actual crystal mass (e.g., a seed crystal weight, a crystal weight at any time) at any time and transmit a weighing signal to the processing device 101. The feeding and weighing component 104 may be used to weigh a feeding weight involved in a feeding operation and send a weighing signal to the processing device 101. In some embodiments, the crystal weighing component 105 and the feeding and weighing component 104 may be collectively referred to as a "weighing component."

The handling component 103 may be used to add a weighed raw material into a growth chamber. In some embodiments, the handling component 103 may include a lifting mechanism 1031, a translation mechanism 1032, a turning mechanism 1033, and a clamping mechanism 1034.

Taking a specific feeding control process as an example, the crystal weighing component 105 may weigh a crystal weight in real time and feedback it to the processing device 101. The processing device 101 may receive the weighing signal to determine whether to perform a feeding operation. If it is determined to perform the feeding operation, the processing device 101 may transmit a control instruction to the control device 102. After receiving the control instruction, the control device 102 may control the feeding and weighing component 104 to weigh a target feeding amount of raw material. After the weighing operation is completed, the control device 102 may control the handling component 103 to add the raw material into the growth chamber. Specifically, the control device 102 may control the clamping mechanism 1034 to clamp a tray containing the raw material, control the lifting mechanism 1031 to move upward to drive the tray upward, control the translation mechanism 1032 to move horizontally to drive the tray to move horizontally to a top of the growth chamber, and control the turning mechanism 1033 to turn over to pour the raw material into the growth chamber, thereby completing the entire feeding process.

The heating component 106 may be used to heat the growth chamber. In some embodiments, the heating component 106 may include an intermediate frequency power controller 1061 and an induction coil 1062. The intermediate frequency power controller 1061 may be used as a closed loop execution unit of temperature control, and used to accurately execute the temperature control instruction of the processing device 101. Specifically, by controlling a current or a voltage of an intermediate frequency power supply, a heating power of the induction coil 1062 may be adjusted. In some embodiments, the intermediate frequency power controller 1061 may perform a signal conversion with the processing device 101 and/or the control device 102 via an RS232-485 converter to transmit temperature data of the induction coil 1062. It should be noted that the heating component 106 may also be directly controlled by the processing device 101, or the control device 102 may be integrated into the processing device 101, and the heating component 106 may be controlled by the control device 102.

The pulling component 107 may be used to drive a seed crystal or a crystal to move upward and downward. For example, before the crystal growth is started, the pulling component 107 may control a pulling rod carrying the seed crystal to move downward. As another example, when the crystal growth is completed, the pulling component 107 may perform an ending operation to pull the crystal upward and away from a liquid surface of the raw material. In some embodiments, the pulling component 107 may include a pulling motor.

The crystal rotation component 108 may be used to drive a seed crystal or a crystal to rotate. For example, during the crystal growth process, the crystal rotation component 108 may control the rotation of the crystal. In some embodiments, the crystal rotation component 108 may include a rotating motor.

The storage device 109 may store various types of data and/or information involved in the crystal growth process. In some embodiments, the storage device 109 may store a parameter (e.g., a temperature, a pulling speed, a crystal rotation speed, a crystal weight), a control instruction, etc., during the crystal growth process. In some embodiments, the storage device 109 may be directly connected to or in communication with one or more components (e.g., the processing device 101, the control device 102, the handling component 103, the feeding and weighing component 104, the crystal weighing component 105, the heating components 106) of the crystal growth control system 100. The one or more components of the crystal growth control system 100 may access the data and/or instructions stored in the storage device 109 via a network or directly. In some embodiments, the storage device 109 may be a portion of the processing device 101 and/or the control device 102. Relevant data (e.g., a temperature control parameter, a pulling control parameter, a reference crystal parameter) during the crystal growth control process may be recorded in the storage device 109 in real time.

In some embodiments, the storage device 109 may store data and/or instructions that the processing device 101 may execute or use to perform exemplary methods described in the present disclosure. In some embodiments, the storage device 109 may include a mass storage, a removable storage, a volatile read-write storage, a read-only storage (ROM), or the like, or any combination thereof. Exemplary mass storages may include a magnetic disk, an optical disk, a solid-state disk, or the like. Exemplary removable storages may include a flash drive, a floppy disk, an optical disk, a memory card, a compact disk, a magnetic tape, or the like.

Exemplary volatile read-only memories may include a random-access memory (RAM). Exemplary RAMs may include a dynamic RAM (DRAM), a double rate synchronous dynamic RAM (DDR SDRAM), a static RAM (SRAM), a thyristor RAM (T-RAM), a zero capacitance RAM (Z-RAM), or the like. Exemplary ROMs may include a mask ROM (MROM), a programmable ROM (PROM), an erasable programmable ROM (EPROM), an electronically erasable programmable ROM (EEPROM), a compact disk ROM (CD-ROM), a digital General disk ROM, etc. In some embodiments, the storage device 109 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The interaction component 110 may be used to interact with a user or other components of the crystal growth control system 100. In some embodiments, the interaction component 110 may include a display device 110-1 and an interaction device 110-2. The display device 110-1 may include a nixie tube display, a two-dimensional display, a three-dimensional display, etc. The interaction device 110-2 may include an input device. The input device may include a mouse, a keyboard, a voice input device, etc.

In some embodiments, the processing device 101 may perform a human-computer interaction with an operator (e.g., a crystal preparation engineer) through the display device 110-1 and the interaction device 110-2. The operator may query an actual crystal parameter, a temperature control parameter, a pulling control parameter, etc. via the display device 110-1.

Figure 2:
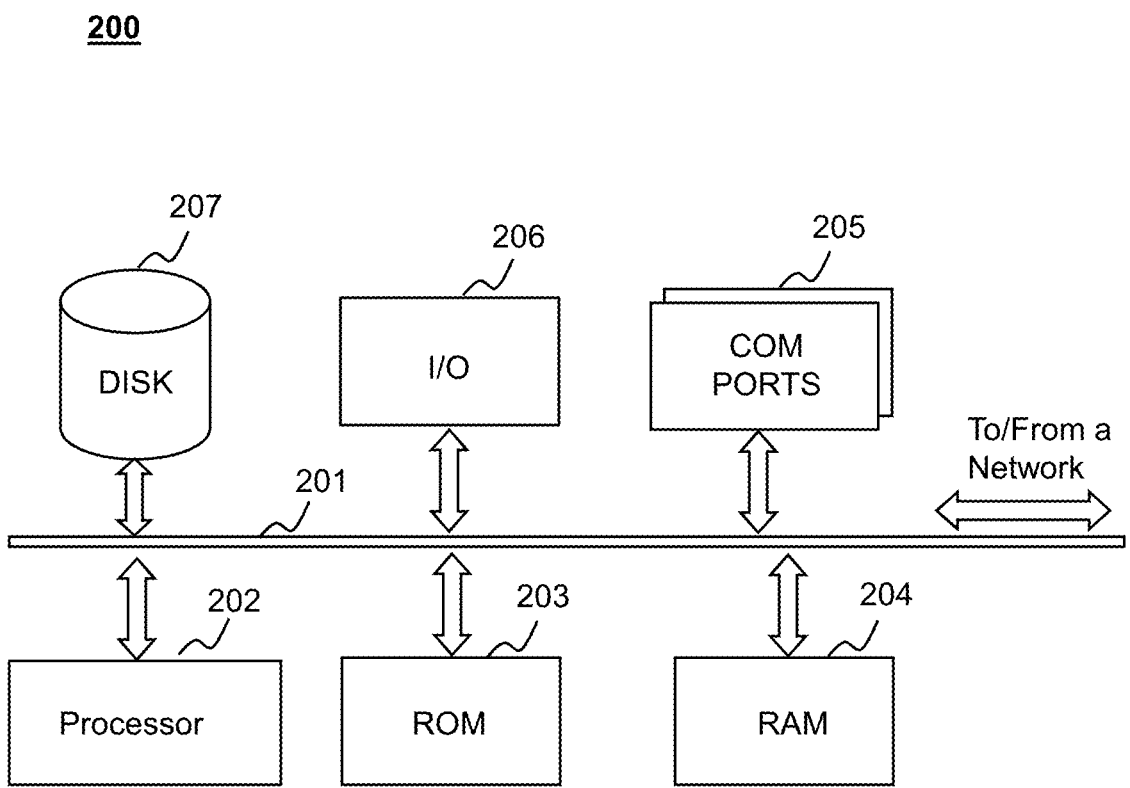
FIG. 2 is a schematic diagram illustrating an exemplary computing device according to some embodiments of the present disclosure.

FIG. 2 is a schematic diagram illustrating an exemplary computing device 200 according to some embodiments of the present disclosure.

In some embodiments, the processing device 101, the control device 102, and/or the storage device 109 may be implemented on the computing device 200, and configured to implement functions disclosed in the present disclosure.

The computing device 200 may include any component that can be used to implement the system described in the present disclosure. For example, a PLC may be implemented on the computing device 200 through hardware, software programs, firmware, or any combination thereof. For convenience, only one computer is shown in the figure, but computation functions related to the feeding control described in the present disclosure may be implemented by a group of similar platforms in a distributed manner to distribute a processing load of the system.

The computing device 200 may include a communication port 205 connected to a network for data communication. The computing device 200 may include a processor 202 (e.g., a CPU) that may execute program instructions in the form of one or more processors. An exemplary computer platform may include an internal bus 201 and various forms of program storages and data storages, for example, a hard disk 207, a read-only memory (ROM) 203, or a random-access memory (RAM) 204, for storing various data files processed and/or transferred by the computer. The computing device may also include program instructions executed by the processor 202 and stored in the ROM 203, the RAM 204, and/or other types of non-transitory storage media. The methods and/or processes described in the present disclosure may be implemented in a form of program instructions. The computing device 200 may also include an input/output component 206 for supporting input/output between the computer and other components. The computing device 200 may also receive programs and data described in the present disclosure through a network communication.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

Figure 3:
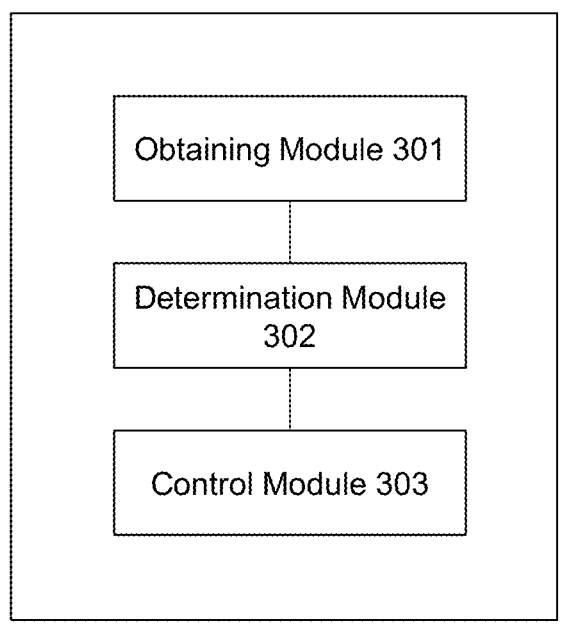
FIG. 3 is a block diagram illustrating an exemplary crystal growth control system according to some embodiments of the present disclosure.

FIG. 3 is a block diagram illustrating an exemplary crystal growth control system according to some embodiments of the present disclosure.

As shown in FIG. 3, a crystal growth control system 300 may include an obtaining module 301, a determination module 302, and a control module 303. In some embodiments, the crystal growth control system 300 may be implemented by the processing device 101 and/or the control device 102, or integrated into the processing device 101 and/or the control device 102.

The obtaining module 301 may be used to obtain an actual crystal parameter in a target time slice. In some embodiments, the obtaining module 301 may be used to obtain a reference crystal parameter in the target time slice. More descriptions regarding obtaining the actual crystal parameter and the reference crystal parameter in the target time slice may be found in FIG. 4 and the descriptions thereof, which are not repeated here.

The determination module 302 may be used to determine a temperature control parameter based on the actual crystal parameter and the reference crystal parameter. In some embodiments, the determination module 302 may be used to determine a pulling control parameter based on the actual crystal parameter and the reference crystal parameter. More descriptions regarding determining the temperature control parameter and the pulling control parameter may be found in FIG. 4 and the descriptions thereof, which are not repeated here.

The control module 303 may be configured to adjust a temperature and a pulling speed in a next time slice after the target time slice, respectively, based on the temperature control parameter and the pulling control parameter. More descriptions regarding adjusting the temperature and the pulling speed in the next time slice after the target time slice may be found in FIG. 4 and the descriptions thereof, which are not repeated here.

It should be understood that the system and the modules thereof shown in FIG. 3 may be implemented in various ways. For example, in some embodiments, the system and the modules thereof may be implemented by hardware, software, or a combination of software and hardware. The hardware portion may be realized by dedicated logic. The software portion may be stored in the memory and executed by an appropriate instruction execution system, such as a microprocessor or a dedicated design hardware. Those skilled in the art may understand that the above methods and systems may be implemented using computer-executable instructions and/or included in processor control codes. For example, such codes may be provided on a carrier medium such as a disk, CD, or DVD-ROM, a programmable memory such as a read-only memory (firmware), or a data carrier such as an optical or an electronic signal carrier. The system and the modules thereof described in the present disclosure may not only be implemented by a hardware circuit such as a very large-scale integrated circuit or a gate array, a semiconductor such as a logic chip, a transistor, etc., or a programmable hardware device such as a field programmable gate array, a programmable logic device, etc. The system and the modules thereof also may be implemented by software executed by various types of processors. The system and the modules thereof also may be implemented by a combination of the above hardware circuit and software (e.g., firmware).

It should be noted that the above description of the crystal growth control system 300 and the modules thereof are merely provided for the purposes of illustration, and not intended to limit the scope of the present disclosure. It should be understood that for those skilled in the art, after understanding the principle of the system, it may be possible to arbitrarily combine various modules, or form a subsystem to connect with other modules without departing from the principle. For example, the obtaining module 301, the determination module 302, and the control module 303 disclosed in FIG. 3 may be different modules in the system, or a single module which can implement the functions of more than two modules. As another example, modules in the crystal growth control system 300 may share a storage module, or each module may have its own storage module. Such variations do not depart from the scope of the present disclosure.

Figure 4:
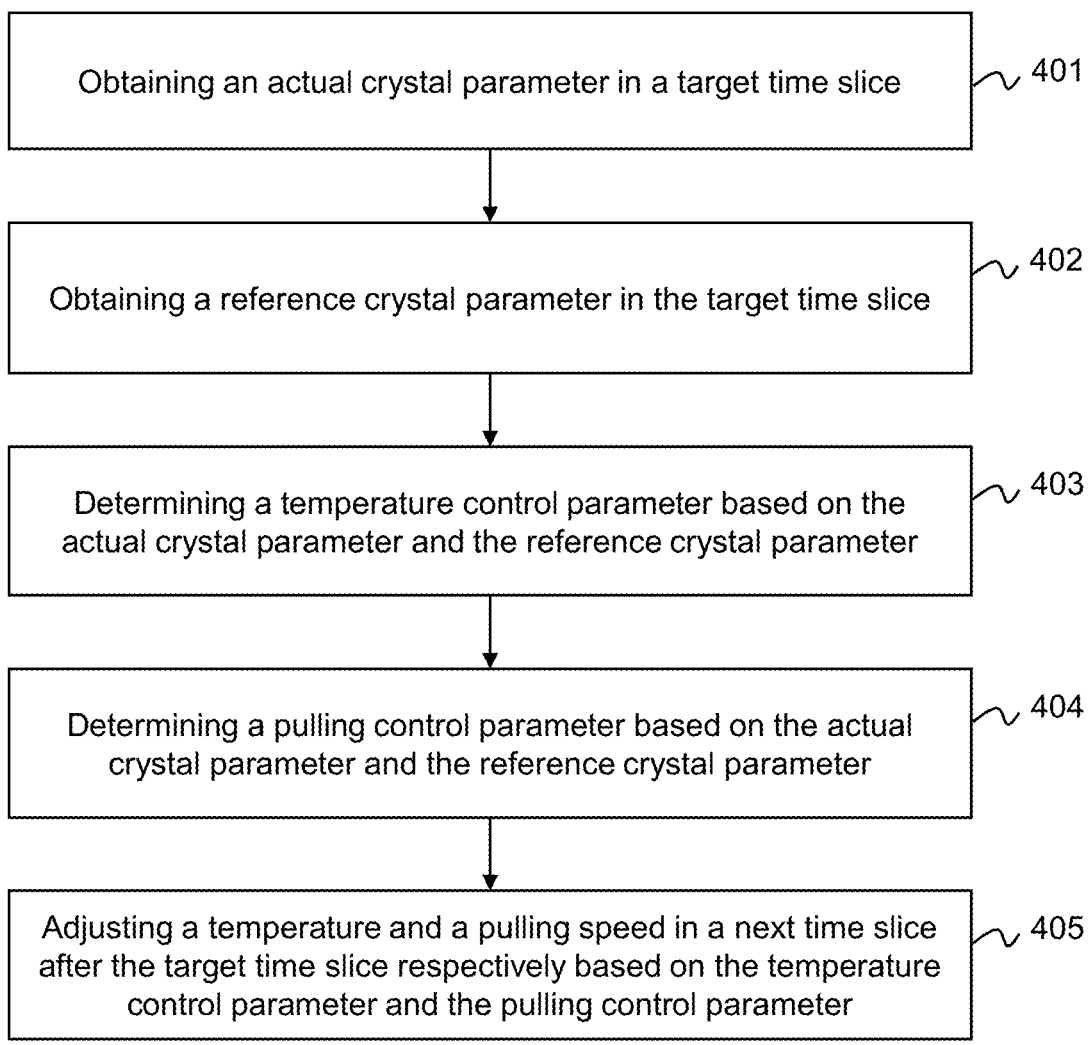
FIG. 4 is a flowchart illustrating an exemplary process for controlling crystal growth according to some embodiments of the present disclosure.

FIG. 4 is a flowchart illustrating an exemplary process for controlling crystal growth according to some embodiments of the present disclosure. In some embodiments, process 400 may be performed by a processing device (e.g., the processing device 101) and/or a control device (e.g., the control device 102). For example, process 400 may be stored in a storage device (e.g., a storage device, a storage unit of the processing device and/or the control device) as a form of programs or instructions. When the processor 202 or the modules shown in FIG. 3 execute the programs or the instructions, process 400 may be implemented. In some embodiments, process 400 may be accomplished with one or more additional operations not described, and/or without one or more of the operations discussed. Additionally, the order of operations as illustrated in FIG. 4 is not intended to be limiting.

In 401, an actual crystal parameter in a target time slice may be obtained. In some embodiments, operation 401 may be executed by the obtaining module 301.

Generally, a crystal growth process starts from preparing for seeding (or after the seeding is completed, that is, from when the crystal starts to grow) to growing to a crystal with a target shape. The crystal growth process may include a plurality of stages (e.g., a seeding stage, a shouldering stage, an equal diameter stage, an ending stage) and may take a relatively long time (e.g., 10 hours, 30 hours, 50 hours, 60 hours, 100 hours). Accordingly, the processing device and/or the control device may divide the crystal growth process into a plurality of moments or a plurality of time slices. In some embodiments, time intervals among the plurality of moments may be the same or different. In some embodiments, time lengths (also referred to simply as "duration") of the plurality of time slices may be the same or different. For instance, the time length of the time slice may be 10 seconds, 15 seconds, 30 seconds, 1 minute, 10 minutes, etc.

In some embodiments, the processing device and/or the control device may determine the time lengths and/or a count of the plurality of time slices according to a related parameter (e.g., a crystal type, a crystal size, a growth stage) of a crystal to be grown. For example, a time length (e.g., 5 seconds, 10 seconds) of a time slice corresponding to the seeding stage or the shouldering stage may be different from a time length (e.g., 30 seconds, 1 minute) of a time slice corresponding to the equal diameter stage.

In some embodiments, the processing device and/or the control device may determine the time lengths and/or the count of the plurality of time slices according to a control accuracy. For example, for a crystal growth process for which a total growth time has been determined, the greater the count of time slices (or the shorter the time length of a single time slice is) is, the higher the control accuracy may be. Conversely, the lower the control accuracy may be. For example, it is assumed that the total growth time is 20 hours, the processing device and/or the control device may divide the total growth time into 1200 time slices according to the control accuracy. The time length of a single time slice may be 1 minute. As another example, the processing device and/or the control device may also divide the total growth time into 400 time slices. The time length of a single time slice may be 3 minutes.

In some embodiments, the processing device and/or the control device may comprehensively consider the control accuracy and a data processing capability of the system to determine the time lengths and/or the count of the plurality of time slices. For example, in combination with the foregoing, the greater the count of time slices is (or the shorter the time length of a single time slice is), the higher the control accuracy may be, but the higher the data processing capability required may be. The processing device and/or the control device may comprehensively determine the time lengths and/or the count of the plurality of time slices under a premise that the required data processing capacity does not exceed a normal data processing capacity.

In some embodiments, the processing device and/or the control device may select any one of the plurality of time slices as the target time slice. In some embodiments, the processing device and/or the control device may select a time slice corresponding to a specific stage (e.g., the equal diameter stage, the ending stage) as the target time slice. In some embodiments, the processing device and/or the control device may select a corresponding time slice as the target time slice according to actual requirements.

In some embodiments, the actual crystal parameter may include an actual crystal mass, an actual crystal diameter, an actual crystal height, an actual crystal shape, or the like, or any combination thereof.

In some embodiments, the actual crystal parameter in the target time slice may characterize an actual growth condition of the crystal in the target time slice. For example, if the target time slice is 10:00:00-10:01:00, the actual crystal mass in the target time slice may be a weight of the crystal increased in the time period of 10:00:00-10:01:00; the actual crystal diameter in the target time slice may be an average value of crystal diameters in the time period of 10:00:00-10:01:00; the actual crystal height in the target time slice may be a height of the crystal increased in the time period of 10:00:00-10:01:00; the actual crystal shape in the target time slice may be a shape of the crystal in the time period of 10:00:00-10:01:00.

In some embodiments, the processing device and/or the control device may obtain an actual crystal mass at an end time and an actual crystal mass at a start time of the target time slice, and determine the actual crystal mass in the target time slice based on a difference between the two masses.

In some embodiments, the processing device and/or the control device may determine the actual crystal height in the target time slice based on a pulling height and a drop height of a liquid level in the target time slice. Specifically, the processing device and/or the control device may determine a sum of the pulling height (which may be expressed as $h_1$) and the drop height of the liquid level (which may be expressed as $h_2$) in the target time slice as the actual crystal height (which may be expressed as h) in the target time slice. That is, $h=h_1+h_2$.

In some embodiments, the processing device and/or the control device may determine the drop height of the liquid level according to a reading of a grating ruler in a crystal growth device. Specifically, the processing device and/or the control device may determine a difference between a reading (which may be expressed as $h_{r2}$) of the grating ruler at the end time and a reading (which may be expressed as $h_{r1}$) of the grating ruler at the starting time of the target time slice as the pulling height. That is, $h_1=h_{r2}-h_{r1}$. In some embodiments, the processing device and/or the control device may determine the pulling height according to an operating parameter of the pulling component. Specifically, the processing device and/or control device may determine the corresponding pulling height (e.g., $h1=n\times\Delta h_1$) according to a count of operations of a pulling motor (which may be expressed as n) and a pulling height corresponding to one operation (which may be expressed as $\Delta h_1$).

In some embodiments, the processing device and/or the control device may determine the drop height of the liquid level based on the actual crystal mass, a density of a raw material under a molten state, and a size of a chamber. Specifically, for example, if no additional raw material for crystal growth is added into the chamber within the target time slice, the processing device and/or the control device may determine the drop height of the liquid level based on formula (1):

$$h_2 = \frac{m/\rho_1}{S_1}, \quad (1)$$

wherein $h_2$ represents the drop height of the liquid level; m represents the actual crystal mass; $\rho_1$ represents the density of the raw material under the molten state; $S_1$ represents a cross-sectional area of the chamber. In some embodiments, if the cross section of the chamber is circular, the cross-sectional area of the chamber may be determined based on a diameter of the circle. If the cross section of the chamber is rectangular, the cross-sectional area of the chamber may be determined based on side lengths of the rectangle.

As another example, if additional raw material for crystal growth is added into the chamber within the target time slice, the processing device and/or the control device may determine the drop height of the liquid level based on formula (2):

$$h_3 = \frac{(m-\Delta m)/\rho_1}{S_1}, \quad (2)$$

wherein $h_3$ represents a drop height of a liquid level; m represents an actual crystal mass; $\Delta m$ represents a feeding mass of raw material; $\rho_1$ represents a density of the raw material under a molten state; $S_1$ represents a cross-sectional area of a chamber. In some embodiments, if the feeding mass of the raw material is equal to the actual crystal mass, the drop height of the liquid level may be zero. Accordingly, the actual crystal height in the target time slice may be equal to the pulling height. That is, $h=h_1$.

In some embodiments, the processing device and/or the control device may determine the actual crystal diameter based on the actual crystal mass and the actual crystal height. Specifically, the processing device and/or the control device may determine the actual crystal diameter based on formula (3):

$$d = 2\sqrt{\frac{m}{\rho_s \times h \times \pi}}, \quad (3)$$

wherein d represents an actual crystal diameter; m represents an actual crystal mass; $\rho_s$ represents a crystal density; h represents an actual crystal height.

In some embodiments, the processing device and/or the control device may obtain the actual crystal shape in the target time slice from an image acquisition device (e.g., a 3D camera). In some embodiments, the processing device and/or the control device may construct a crystal growth model based on the actual crystal mass, the actual crystal diameter, the actual crystal height, the crystal density, etc., and determine the actual crystal shape based on the crystal growth model. More descriptions regarding constructing the crystal growth model may be found in FIG. 5 and the description thereof, which are not repeated here.

In 402, a reference crystal parameter in the target time slice may be obtained. In some embodiments, operation 402 may be executed by the obtaining module 301.

In some embodiments, the reference crystal parameter may include a reference crystal mass, a reference crystal diameter, a reference crystal height, a reference crystal shape, or the like, or any combination thereof.

In some embodiments, the reference crystal parameter in the target time slice may characterize a theoretical growth condition of the crystal in the target time slice during the crystal growth process. For example, if the target time slice is 10:00:00-10:01:00, the reference crystal mass in the target time slice may be a weight of the crystal theoretically increased in the time period of 10:00:00-10:01:00; the reference crystal diameter in the target time slice may be an average value of theoretical crystal diameters in the time period of 10:00:00-10:01:00; the reference crystal height in the target time slice may be a height of the crystal theoretically increased in the time period of 10:00:00-10:01:00; the reference crystal shape in the target time slice may be a theoretical shape of the crystal in the time period of 10:00:00-10:01:00.

In some embodiments, the processing device and/or the control device may construct (e.g., according to a three-dimensional modeling method) a crystal growth model based on a preset crystal parameter and/or a preset crystal growth parameter, and determine the reference crystal parameter in the target time slice based on the crystal growth model. In some embodiments, the processing device and/or the control device may also determine a reference crystal growth parameter (e.g., a reference crystal growth speed, a reference growth coefficient) corresponding to the target time slice based on the crystal growth model. In the present disclosure, "reference crystal parameter" and "reference crystal growth parameter" may also be collectively referred to as "reference crystal parameter." That is, the reference crystal parameter may include the reference crystal mass, the reference crystal diameter, the reference crystal height, the reference crystal shape, the reference crystal growth speed, the reference growth coefficient, or the like, or any combination thereof.

In some embodiments, the crystal growth model may characterize a theoretical growth of the crystal throughout the growth process. In some embodiments, the preset crystal parameter may include a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, a ratio of a transition angle between the seed crystal and a shoulder front end to a transition angle between a shoulder end and a front end at the equal diameter, or the like, or any combination thereof. In some embodiments, the preset crystal growth parameter may include a preset crystal growth speed (e.g., preset crystal growth speeds corresponding to different crystal growth stages), a preset growth coefficient (e.g., preset growth coefficients corresponding to different crystal growth stages), or the like, or any combination thereof. More descriptions of the crystal growth model may be found in FIGS. 5-7 and the descriptions thereof, which are not repeated here.

In 403, a temperature control parameter may be determined based on the actual crystal parameter and the reference crystal parameter. In some embodiments, operation 403 may be executed by the determination module 302.

In some embodiments, the temperature control parameter may be used to control a temperature of a furnace in the crystal growth device. Specifically, the temperature control parameter may include a change of a heating parameter (e.g., a power change of an intermediate frequency power supply, a current change of the intermediate frequency power supply, a power change of an induction coil, a current change of the induction coil) used to control a heating component (e.g., the intermediate frequency power supply, the induction coil). In some embodiments, the temperature control parameter may also include a change of a heating exchange parameter (e.g., a flow change of a circulating water, a flow speed change of the circulating water) used to control a heating exchange component (e.g., a heating exchange component of circulating water on a furnace body of the crystal growth device) in the crystal growth device.

In some embodiments, the processing device and/or the control device may determine the temperature control parameter based on a difference between the actual crystal parameter and the reference crystal parameter and the reference crystal growth parameter (e.g., the reference growth coefficient). More descriptions regarding determining the temperature control parameter may be found in FIG. 8 and the description descriptions, which are not repeated here.

In 404, a pulling control parameter may be determined based on the actual crystal parameter and the reference crystal parameter. In some embodiments, operation 404 may be executed by the determination module 302.

In some embodiments, the pulling control parameter may be used to control a pulling process of a pulling component (e.g., a pulling motor) in the crystal growth device. Specifically, the pulling control parameter may include a parameter for controlling a change of a pulling parameter (e.g., a change of a rotation speed of the pulling motor, a change of a power of the pulling motor) of the pulling component.

In some embodiments, the processing device and/or the control device may determine or adjust the pulling control parameter based on the actual crystal parameter and the reference crystal parameter (e.g., a difference between the actual crystal mass and the reference crystal mass, a difference between the actual crystal diameter and the reference crystal diameter). For example, if the difference between the actual crystal mass and the reference crystal mass is greater than a preset threshold, the processing device and/or the control device may increase the pulling control parameter.

In some embodiments, the processing device and/or the control device may determine the pulling control parameter based on a drop speed of the liquid level and the reference crystal growth parameter (e.g., the reference crystal growth speed). Specifically, in combination with formula (1) and formula (2) described above, the processing device and/or the control device may obtain the actual crystal mass, the melting density of the raw material, the size of the chamber, and a feeding mass of raw material in the target time slice (if any), determine the drop height of the liquid level in the target time slice, and then determine the drop speed of the liquid level in the target time slice. Further, the pulling control parameter may be determined based on the drop speed of the liquid level and the reference crystal growth parameter. More descriptions regarding determining the pulling control parameter may be found in FIG. 9 and the descriptions thereof, which are not repeated here.

In 405, a temperature and a pulling speed in a next time slice after the target time slice may be adjusted respectively based on the temperature control parameter and the pulling control parameter. In some embodiments, operation 405 may be executed by the control module 303.

In some embodiments, the processing device and/or the control device may adjust the crystal growth in the next target time slice by adjusting the temperature (e.g., the temperature of the furnace in the crystal growth device) and the pulling speed (e.g., the pulling speed of the pulling motor) in the next target time slice based on a difference between an actual situation of the crystal and a theoretical situation of the crystal in the target time slice.

In some embodiments, the processing device and/or the control device may adjust the temperature in the next time slice after the target time slice based on a heating parameter and a temperature control parameter of the heating component in the target time slice. In some embodiments, the heating parameter of the heating component in the target time slice may be an average heating parameter of the heating component in the target time slice (e.g., an average power of the induction coil, an average current of the induction coil) or a value of the heating parameter (e.g., a power value of the induction coil, a current value of the induction coil) at the end time of the target time slice.

In some embodiments, similarly, the processing device and/or the control device may adjust the pulling speed in the next time slice after the target time slice based on the pulling speed and the pulling control parameter of the pulling component in the target time slice. In some embodiments, the pulling speed in the target time slice may be an average pulling speed in the target time slice or a pulling speed at the end time of the target time slice.

Merely by way of example, if the target time slice is 10:00:00-10:01:00, the temperature of the furnace in the crystal growth device in the target time slice is 2000° C., the pulling speed is 10 centimeters/hour, the power of the induction coil is 2200 kW (or the current is 10 A), the rotation speed of the pulling motor is 1000 revolutions/minute (or the power is 3 kW), the temperature control parameter determined according to operation 403 is that the power change of the induction coil is +1 kW (or a current change is +0.1 A), and the pulling control parameter determined according to operation 404 is that the rotation speed change of the pulling motor is −3 revolutions/minute (or the power is −0.1 kW). Accordingly, in the next time slice 10:01:00-10:02:00, the control module 303 may adjust the power of the induction coil in the crystal growth device to 2201 kW (or adjust the current of the induction coil to 10.1 A), and adjust the rotation speed of the pulling motor to 997 revolutions/minute (or adjust the power of the pulling motor to 2.9 kW).

In some embodiments, the processing device and/or the control device may execute operations 401 to 405 in sequence in multiple cycles to control the entire crystal growth process to achieve an automatic crystal growth control.

In some embodiments, the processing device and/or the control device may also determine or adjust a crystal rotation control parameter based on the actual crystal parameter and the reference crystal parameter (e.g., the difference between the actual crystal mass and the reference crystal mass, the difference between the actual crystal diameter and the reference crystal diameter). The crystal rotation control parameter may include a parameter for controlling a crystal rotation parameter change (e.g., a rotation speed change of a crystal rotation motor, a power change of a crystal rotation motor) of a crystal rotation component. For example, if the difference between the actual crystal mass and the reference crystal mass is greater than a preset threshold, the processing device and/or the control device may increase the crystal rotation control parameter.

According to some embodiments of the present disclosure, during the crystal growth control process, the temperature control parameter and the pulling control parameter in the next time slice may be determined based on the actual crystal parameter and the reference crystal parameter in a previous time slice. The temperature and the pulling speed in the next time slice may be adjusted based on the temperature control parameter and the pulling control parameter, respectively. Since the division of time slices can be determined according to a parameter related to the crystal to be grown and/or a control accuracy requirement, the entire crystal growth process can be controlled according to operations 401-405 efficiently and accurately. In addition, since the reference crystal parameter is determined based on the theoretical crystal growth model, the actual crystal parameter of the crystal finally grown would be close to the theoretical crystal parameter.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, process 400 may include a storing operation. In the storing operation, the processing device and/or the control device may store information and/or data (e.g., the temperature control parameter, the pulling control parameter) involved in process 400 in a storage device (e.g., the storage device 109). As another example, the reference crystal parameter and/or the reference crystal growth parameter may be a system default value, a user-defined value, etc., instead of determined based on the crystal growth model.

Figure 5:
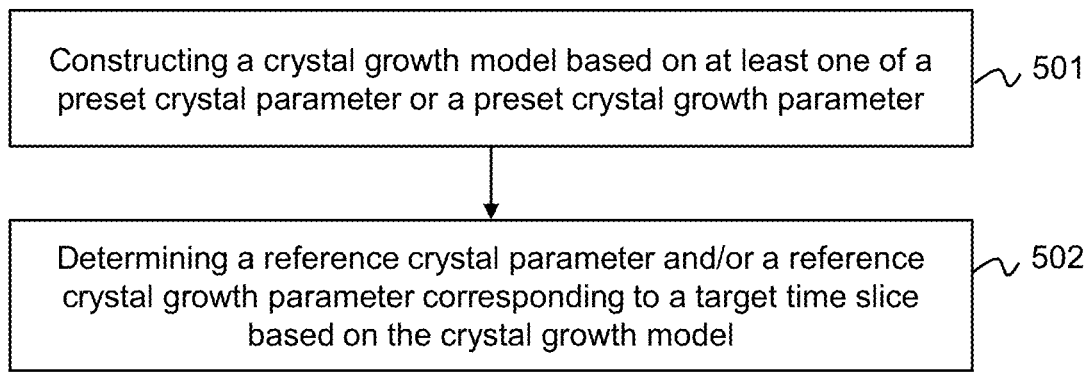
FIG. 5 is a flowchart illustrating an exemplary process for determining a reference crystal parameter according to some embodiments of the present disclosure.

FIG. 5 is a flowchart illustrating an exemplary process for determining a reference crystal parameter according to some embodiments of the present disclosure. In some embodiments, process 500 may be performed by a processing device (e.g., the processing device 101) and/or a control device (e.g., the control device 102). For example, process 500 may be stored in a storage device (e.g., a storage device, a storage unit of the processing device and/or the control device) in a form of programs or instructions. When the processor 202 or the modules shown in FIG. 3 execute the programs or instructions, process 500 may be implemented. In some embodiments, process 500 may be accomplished with one or more additional operations not described, and/or without one or more of the operations discussed. Additionally, the order of the operations as illustrated in FIG. 5 is not intended to be limiting.

In 501, a crystal growth model may be constructed based on at least one of a preset crystal parameter or a preset crystal growth parameter. In some embodiments, operation 501 may be executed by the determination module 302.

In some embodiments, the crystal growth model may characterize a theoretical growth condition of the crystal in an entire growth process. In some embodiments, the crystal growth model may be used to determine the reference crystal parameter that changes over time.

In some embodiments, the preset crystal parameter may include a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, a ratio of a transition angle between the seed crystal and a shoulder front end to a transition angle between a shoulder end and a front end at the equal diameter, or the like, or any combination thereof. In some embodiments, the preset crystal growth parameter may include a preset crystal growth speed (e.g., preset crystal growth speeds corresponding to different crystal growth stages), a preset growth coefficient (e.g., preset growth coefficients corresponding to different crystal growth stages), or the like, or any combination thereof. More descriptions of the preset crystal parameter and/or the preset crystal growth parameter may be found in FIGS. 6-7 and the descriptions thereof, which are not repeated here.

In some embodiments, the preset crystal parameter and/or the preset crystal growth parameter may be automatically set by the system (e.g., determined based on an empirical value, big data statistics, machine learning), manually set by a user, or semi-automatically set (i.e., a combination of automatic setting and manual setting). For example, according to a crystal type, the processing device and/or the control device may automatically determine various other preset crystal parameters and/or preset crystal growth parameters corresponding to the crystal type. As another example, according to a crystal type and a crystal size, the processing device and/or the control device may automatically determine various other preset crystal parameters and/or preset crystal growth parameters corresponding to the crystal type.

In some embodiments, the processing device and/or the control device may construct a crystal growth model based on the preset crystal parameter and/or the preset crystal growth parameter according to a three-dimensional modeling method. Exemplary three-dimensional modeling algorithms may be constructing a geometric model according to the preset crystal parameter and/or the preset crystal growth parameter.

In some embodiments, when constructing the crystal growth model, the processing device and/or the control device may also consider a parameter that may be involved in the crystal growth process, such as an internal stress, an internal defect, an internal component distribution, a continuity of different crystal growth stages (to avoid parameter mutations), etc., so that the constructed crystal growth model may accurately reflect the entire crystal growth process.

In some embodiments of the present disclosure, by constructing the crystal growth model based on the preset crystal parameter and/or the preset crystal growth parameter, the crystal growth model may not only reflect shape data of the crystal, but also reflect control data of each growth stage. Accordingly, the crystal growth process can be controlled accurately and effectively based on the crystal growth model.

In 502, a reference crystal parameter and/or a reference crystal growth parameter corresponding to a target time slice may be determined based on the crystal growth model. In some embodiments, operation 502 may be executed by the determination module 302.

As described above, the crystal growth model may characterize the theoretical growth condition of the crystal in the entire growth process. Accordingly, the processing device and/or the control device may determine the reference crystal parameter (which may reflect a theoretical growth condition of the crystal in the target time slice) corresponding to the target time slice based on the crystal growth model. For example, the processing device and/or the control device may input the target time slice into the crystal growth model and determine the reference crystal parameter and/or the reference crystal growth parameter corresponding to the target time slice based on an output of the crystal growth model.

According to some embodiments of the present disclosure, the crystal growth model may be constructed based on the preset crystal parameter and/or the preset crystal growth parameter, which may characterize the theoretical growth of the crystal in the entire growth process. Accordingly, the reference crystal parameter and/or the reference crystal growth parameter corresponding to any time or any time slice in the growth process can be determined based on the crystal growth model. Furthermore, a subsequent growth process can be controlled accurately and effectively based on the determined reference crystal parameter and/or the reference crystal growth parameter.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, after the crystal growth model is constructed, the processing device and/or the control device may store the crystal growth model in a storage device (e.g., the storage device 109).

FIG. 6 is an exemplary interface for determining a preset crystal parameter according to some embodiments of the present disclosure. FIG. 7 is an exemplary interface for determining a preset crystal growth parameter according to some embodiments of the present disclosure.

As shown in FIG. 6, a user may manually input a preset crystal parameter (e.g., "geometric parameter" shown in the figure) via an interface 600. Referring to FIG. 5, the preset crystal parameter may include a crystal type (e.g., a crystal number), a preset crystal density (e.g., a solid density, a liquid density), a preset crystal mass, a preset seed crystal height, a preset seed crystal diameter, a preset shoulder height, a preset height at an equal diameter (e.g., a height at equal diameter 1, a height at equal diameter 2, a height at equal diameter 3, a height at equal diameter 4), a preset diameter at the equal diameter, a preset tail height, a preset crystal tail height, a preset crystal tail diameter, a preset shoulder angle, a preset tail angle, R1/R2 (i.e., a ratio of a transition angle between the seed crystal and a shoulder front end (e.g., shoulder 1 in FIG. 7) to a transition angle between a shoulder end (e.g., shoulder 3 in FIG. 7) and a front end at the equal diameter (e.g., equal diameter 1 in FIG. 6 or FIG. 7), or the like, or any combination thereof.

In some embodiments, after the user inputs the preset crystal parameter, the interface 600 may also display a computation result determined based on the preset crystal parameter, for example, a theoretical mass, a theoretical pulling height, a theoretical drop height of a liquid level, a theoretical crystal length, etc.

In some embodiments, the interface 600 may also display a diameter of a crucible. The user may also manually input the diameter of the crucible.

In some embodiments, after the user inputs the preset crystal parameter, the processing device and/or the control device may construct a preliminary crystal growth model based on the preset crystal parameter. The processing device and/or the control device may display a preview of an outline drawing corresponding to the preliminary crystal growth model via the interface 600. Through the outline drawing preview, the user may intuitively change a corresponding parameter. In addition, through the computation result (e.g., the theoretical mass, the theoretical pulling height, the theoretical drop height of the liquid level, the theoretical crystal length) displayed on the interface 600, the user may check whether a current crystal growth model satisfies a target design requirement.

Further, as shown in FIG. 7, the user may input a preset crystal growth parameter (e.g., "control parameter" shown in the figure) via an interface 700. As shown in FIG. 7, a column of "height" on the left side of the figure is the preset crystal parameter input by the user via the interface 600. When a preset crystal growth coefficient is input via the interface 700, the user may further adjust the preset crystal parameter. Referring to FIG. 5, the preset crystal growth parameter may include a preset crystal growth speed (e.g., preset crystal growth speeds corresponding to different crystal growth stages), a preset growth coefficient (e.g., proportional terms and/or integral terms corresponding to different crystal growth stages), a preset rotation crystal speed (e.g., preset rotation crystal speeds corresponding to different crystal growth stages), or the like, or any combination thereof.

In some embodiments, after the preset crystal growth parameter is input by the user, the processing device and/or the control device may construct a final crystal growth model based on the preliminary crystal growth model. As described elsewhere in the present disclosure, the processing device and/or the control device may control the entire crystal growth process based on the crystal growth model.

Figure 8:
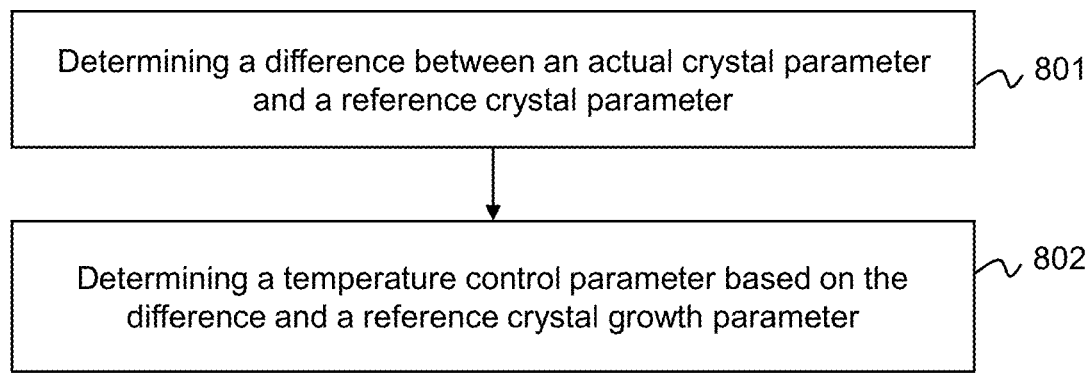
FIG. 8 is a flowchart illustrating an exemplary process for determining a temperature control parameter according to some embodiments of the present disclosure.

FIG. 8 is a flowchart illustrating an exemplary process for determining a temperature control parameter according to some embodiments of the present disclosure. In some embodiments, process 800 may be performed by a processing device (e.g., the processing device 101) and/or a control device (e.g., the control device 102). For example, process 800 may be stored in a storage device (e.g., a storage device, a storage unit of the processing device and/or the control device) in a form of programs or instructions. When the processor 202 or the modules shown in FIG. 3 execute the programs or instructions, process 800 may be implemented. In some embodiments, process 800 may be accomplished with one or more additional operations not described, and/or without one or more of the operations discussed. Additionally, the order of the operations as illustrated in FIG. 8 is not intended to be limiting.

In 801, a difference between an actual crystal parameter and a reference crystal parameter may be determined. In some embodiments, operation 801 may be executed by the determination module 302.

As described in connection with FIG. 5, the actual crystal parameter may include an actual crystal mass, an actual crystal diameter, an actual crystal height, an actual crystal shape, or the like, or any combination thereof. The reference crystal parameter may include a reference crystal mass, a reference crystal diameter, a reference crystal height, a reference crystal shape, or the like, or any combination thereof.

In some embodiments, the difference between the actual crystal parameter and the reference crystal parameter may include a difference between the actual crystal mass and the reference crystal mass. For example, if the actual crystal mass is $m_1$ and the reference crystal mass is $m_2$, the difference between the actual crystal mass and the reference crystal mass may be an absolute value of the difference between the two (i.e., $|m_1-m_2|$).

In some embodiments, the difference between the actual crystal parameter and the reference crystal parameter may include a difference between the actual crystal diameter and the reference crystal diameter. For example, if the actual crystal diameter is $d_1$ and the reference crystal diameter is $d_2$, the difference between the actual crystal diameter and the reference crystal diameter may be an absolute value of the difference between the two (i.e., $|d_1-d_2|$).

In some embodiments, the difference between the actual crystal parameter and the reference crystal parameter may include a difference between the actual crystal height and the reference crystal height, a difference between the actual crystal shape and the reference crystal shape, or the like, the descriptions of which are not repeated here.

In some embodiments, the difference between the actual crystal parameter and the reference crystal parameter may be reflected in a form of a numerical value, a formula, a vector, a matrix, a text, an image, etc.

In some embodiments, the processing device and/or the control device may display the difference between the actual crystal parameter and the reference crystal parameter via an interface (e.g., an interface 1000). For example, as shown in FIG. 10, the processing device and/or the control device may display the difference between the actual crystal diameter and the reference crystal diameter in a form of a graph via the interface 1000.

In 802, a temperature control parameter may be determined based on the difference and a preset reference crystal growth parameter. In some embodiments, operation 802 may be executed by the determination module 302.

In some embodiments, referring to FIG. 4 and FIG. 5, the processing device and/or the control device may determine the reference crystal growth parameter corresponding to a target time slice. For example, the processing device and/or the control device may determine the reference crystal growth parameter corresponding to the target time slice based on a crystal growth model. In some embodiments, the reference crystal growth parameter may include a reference growth coefficient, a reference growth speed, or the like, or any combination thereof. In some embodiments, the reference growth coefficient may include a proportional term, an integral term, or the like.

In some embodiments, as described elsewhere in the present disclosure, when constructing the crystal growth model, the processing device and/or the control device may consider a factor such as a continuity of different crystal growth stages. Accordingly, the reference crystal growth parameter determined based on the crystal growth model may also satisfy a continuity requirement. That is, the reference crystal growth parameters at different moments or between different time slices may be continuous or gradual. For example, if a proportional term of an equal diameter stage 1 is 2, a proportional term of an equal diameter stage 2 is 5, and a duration of the equal diameter stage 1 is 1 hour, a change speed of the proportional term in the equal diameter stage 1 may be 0.05/minute (i.e., continuously changes from 2 to 5).

In some embodiments, the temperature control parameter may be used to control a temperature of a furnace in the crystal growth device. Specifically, the temperature control parameter may include a change of a heating parameter (e.g., a power change of an intermediate frequency power supply, a current change of the intermediate frequency power supply, a power change of an induction coil, a current change of the induction coil) used to control a heating component (e.g., the intermediate frequency power supply, the induction coil). More descriptions of the temperature control parameter may be found in the description of operation 403, which are not repeated here.

Merely by way of example, the determination module 302 may determine the temperature control parameter according to formula (4):

$$W = P \times \Delta e + \frac{\int \Delta e \, dt}{I}, \tag{4}$$

wherein W represents a temperature control parameter; $\Delta e$ represents a difference between an actual crystal mass and a reference crystal mass (or a difference between an actual crystal diameter and a reference crystal diameter); P represents a proportional term; I represents an integral term; dt represents a duration of a target time slice.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the reference crystal growth parameter may be a system default value, a user-defined value, etc., instead of determined by the crystal growth model. It should be understood that the reference crystal growth parameter determined by any method should also satisfy the continuity requirement.

FIG. 9 is a flowchart illustrating an exemplary process for determining a pulling control parameter according to some embodiments of the present disclosure. In some embodiments, process 900 may be performed by a processing device (e.g., the processing device 101) and/or a control device (e.g., the control device 102). For example, process 900 may be stored in a storage device (e.g., a storage device, a storage unit of the processing device and/or the control device) in a form of programs or instructions. When the processor 202 or the modules shown in FIG. 3 execute the program or instruction, process 900 may be implemented. In some embodiments, process 900 may be accomplished with one or more additional operations not described, and/or without one or more of the operations discussed. Additionally, the order of the operations as illustrated in FIG. 9 is not intended to be limiting.

In 901, a drop speed of a liquid level in a target time slice may be determined based on an actual crystal mass, a melting density of a raw material, and a size of a chamber. Specifically, the operation may be executed by the determination module 302.

In some embodiments, in combination with formula (1), the processing device and/or the control device may determine the drop height of the liquid level in the target time slice based on the actual crystal mass, the melting density of the raw material, and the size of the chamber. In some embodiments, in combination with formula (2), the processing device and/or the control device may determine the drop height of the liquid level in the target time slice based on the actual crystal mass, the melting density of the raw material, the size of the chamber, and a feeding mass of raw material in the target time slice.

Further, the processing device and/or the control device may determine the drop speed of the liquid level in the target time slice based on the drop height of the liquid level and the duration of the target time slice. For example, the drop speed of the liquid level in the target time slice=the drop height of the liquid level in the target time slice/the duration of the target time slice.

In 902, a pulling control parameter may be determined based on the drop speed of the liquid level and a reference crystal growth parameter. Specifically, the operation may be executed by the determination module 302.

In some embodiments, referring to FIG. 4 and FIG. 5, the processing device and/or the control device may determine the reference crystal growth parameter corresponding to the target time slice. For example, the processing device and/or the control device may determine the reference crystal growth parameter corresponding to the target time slice based on the crystal growth model. In some embodiments, the reference crystal growth parameter may include a reference growth coefficient, a reference growth speed, or the like, or any combination thereof.

In some embodiments, the pulling control parameter may be used to control a pulling process of a pulling component (e.g., a pulling motor) in the crystal growth device. Specifically, the pulling control parameter may include a parameter for controlling a change of the pulling parameter of the pulling component (e.g., a change of a rotation speed of the pulling motor, a change of a power of the pulling motor). More descriptions regarding the pulling control parameter may be found in the description of operation 404, which are not repeated here.

In some embodiments, the determination module 302 may determine the pulling control parameter based on formula (5):

$$\Delta P = a^*(v_r - v_l) - P_c \quad (5)$$

wherein $\Delta P$ represents a pulling control parameter; a represents a conversion coefficient between a rotation speed (or power) of a pulling motor and a pulling speed; $v_r$ represents a reference growth speed; $v_l$ represents a drop speed of a liquid level; $P_c$ represents a rotation speed (or power) of a pulling motor corresponding to a target time slice.

In some embodiments, the processing device and/or the control device may determine or adjust the pulling control parameter based on the difference between the actual crystal parameter and the reference crystal parameter (e.g., a difference between the actual crystal mass and the reference crystal mass, a difference between the actual crystal diameter and the reference crystal diameter). For example, if the difference between the actual crystal mass and the reference crystal mass is greater than a preset threshold, the processing device and/or the control device may increase the pulling control parameter.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 11:
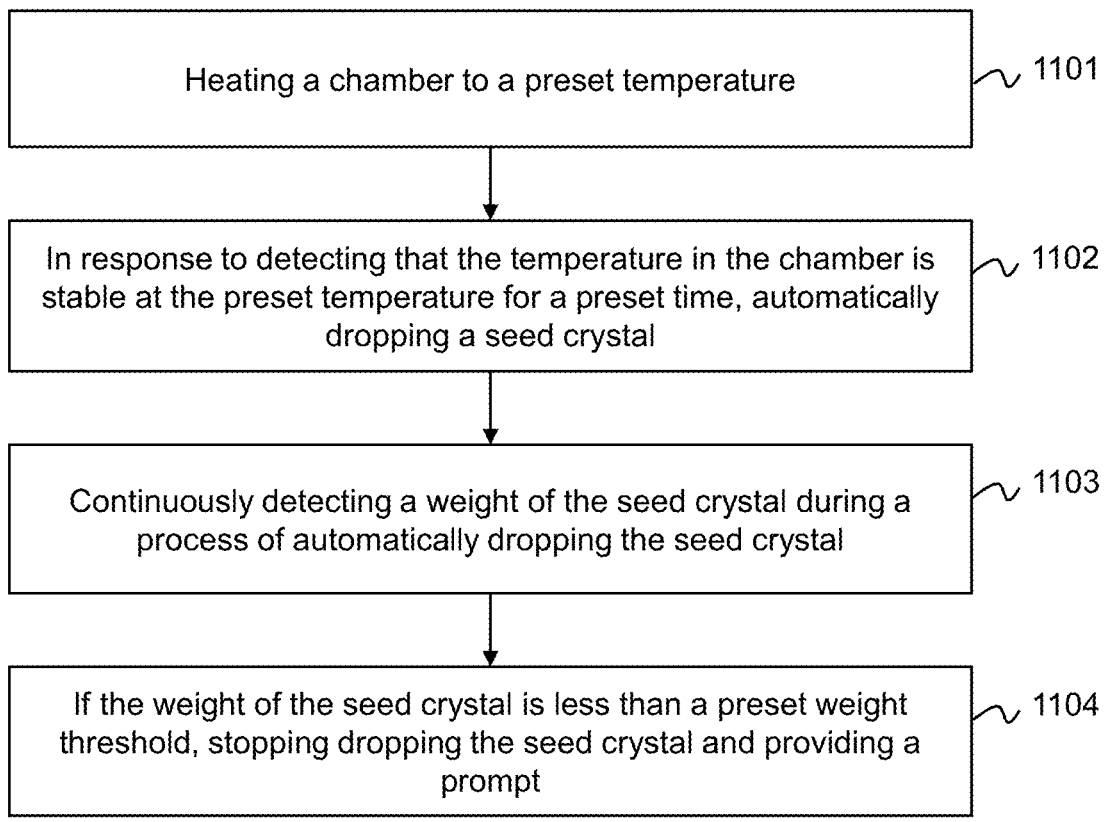
FIG. 11 is a flowchart illustrating an exemplary process for controlling a drop of a seed crystal according to some embodiments of the present disclosure.

FIG. 11 is a flowchart illustrating an exemplary process for controlling a drop of a seed crystal according to some embodiments of the present disclosure. In some embodiments, process 1100 may be performed by a processing device (e.g., the processing device 101) and/or a control device (e.g., the control device 102). For example, process 1100 may be stored in a storage device (e.g., a storage device, a storage unit of the processing device and/or the control device) in a form of programs or instructions. When the processor 202 or the modules shown in FIG. 3 execute the program or instruction, process 1100 may be implemented. In some embodiments, the process 1100 may be accomplished with one or more additional operations not described, and/or without one or more of the operations discussed. Additionally, the order of the operations as illustrated in FIG. 11 is not intended to be limiting.

In 1101, a chamber may be heated to a preset temperature. In some embodiments, operation 1101 may be executed by the control module 303.

In some embodiments, the preset temperature may be a melting temperature of a raw material, a temperature at which a crystal starts to grow, or any temperature value between the melting temperature of the raw material and the temperature at which the crystal starts to grow. In some embodiments, the preset temperature may be a system default value. Alternatively, the preset temperature may be set by a user in combination with an actual requirement. In some embodiments, different crystal types may correspond to different preset temperatures. In some embodiments, different crystal growth parameters (e.g., a crystal shape, a crystal height, a crystal diameter) may correspond to different preset temperatures. In some embodiments, different chambers (e.g., chambers with different shapes, different sizes, different thermal conductivities) may correspond to different preset temperatures.

In some embodiments, the processing device and/or the control device may heat the chamber via a heating component (e.g., the heating component 106). In some embodiments, a temperature sensor may be provided in the chamber. When the temperature sensor senses that a temperature in the chamber reaches the preset temperature, the processing device and/or the control device may provide a prompt (e.g., provide a prompt such as a voice or a buzzer) via a prompting device.

In 1102, in response to detecting that the temperature in the chamber is stable at the preset temperature for a preset time, a seed crystal may be automatically dropped. In some embodiments, operation 1102 may be executed by the control module 303.

In some embodiments, the preset time may be a system default value, or may be adjusted according to different situations. For example, the preset time may be 5 minutes, 10 minutes, 20 minutes, 30 minutes, 40 minutes, 1 hour, 1.5 hours, etc.

In some embodiments, different crystal types may correspond to different preset times. In some embodiments, different crystal growth parameters (e.g., the crystal shape, the crystal height, the crystal diameter) may correspond to different preset times. In some embodiments, different chambers (e.g., chambers with different shapes, different sizes, different thermal conductivities) may correspond to different preset times. The preset time only needs to ensure that the raw material can be completely melted and may be set according to an actual requirement, which may not be limited in the present disclosure.

In some embodiments, the processing device and/or the control device may control a movement of a pulling motor to slowly drop the seed crystal. In some embodiments, a drop speed of the seed crystal may be a system default value or may be adjusted according to different situations.

In 1103, a weight of the seed crystal may be continuously detected during a process of automatically dropping the seed crystal. In some embodiments, operation 1103 may be executed by the control module 303.

In some embodiments, during the process of dropping the seed crystal, the processing device and/or the control device may monitor the weight of the seed crystal in real time via a weighing component (e.g., the crystal weighing component 105).

In 1104, if the weight of the seed crystal is less than a preset weight threshold, the dropping of the seed crystal may be stopped and a prompt may be provided. In some embodiments, operation 1104 may be executed by the control module 303.

During the continuous dropping of the seed crystal, after the seed crystal contacts the liquid level of the raw material, a bottom end of the seed crystal may be melted and the weight of the seed crystal may be reduced. Subsequently, the processing device and/or the control device may continue to slowly drop the seed crystal in the molten raw material. In this process, the weight of the seed crystal may gradually decrease. The processing device and/or the control device may continuously monitor the weight of the seed crystal. When it is detected that the weight of the seed crystal is less than the preset weight threshold (or a sudden decrease of the weight of the seed crystal (e.g., a weight difference between a current moment and a previous moment) is greater than a preset weight difference threshold), it may indicate that the seed crystal hits a wall of the chamber at the current moment. The processing device and/or the control device may provide the prompt. For example, the processing device and/or the control device may provide the prompt by providing the voice or the buzzer.

In some embodiments, the preset weight threshold may be a minimum weight of the seed crystal after the seed crystal contacts the liquid level of the raw material and is melted. The preset weight difference threshold may be a maximum weight that the seed crystal can reduce between adjacent moments. In some embodiments, the preset weight threshold and/or the preset weight difference threshold may be system default values or may be adjusted according to different situations. For example, the preset weight threshold may be 0.8 times or 0.7 times the weight of the seed crystal. As another example, the preset weight difference threshold may be 1 gram, 2 grams, etc.

In some embodiments, the processing device and/or the control device may also obtain a real-time image of the inside of the chamber (e.g., an image of the seed crystal captured by an infrared high-definition camera) during the process of dropping the seed crystal. The real-time image may be compared with a preset reference image. A determination may be made as to whether to adjust a heating parameter (e.g., a parameter of the heating component 106) based on a comparison result. In some embodiments, the preset reference image may be an image at each time point when the seed crystal is theoretically normally melted.

Specifically, when the seed crystal contacts the liquid level of the raw material, for example, the real-time image shows that the seed crystal forms a meniscus with the liquid of the raw material, or when the weight of the seed crystal fluctuates within a preset range (e.g., a sudden increase or a sudden decrease of 1-2 grams), the processing device and/or the control device may compare (e.g., determine a similarity) relevant information in the real-time image (e.g., a size, a brightness of the meniscus, a size of a meniscus aperture, a flow range of a flow line of the raw material liquid) with corresponding information in the preset reference image. A determination may be made as to whether to adjust the heating parameter based on the comparison result. For example, if the similarity is greater than a preset similarity threshold, it may be determined that there is no need to adjust the heating parameter. If the similarity is less than or equal to the preset similarity threshold, the heating parameter may need to be adjusted.

In some embodiments, the processing device and/or the control device may divide the preset reference image and the real-time image into a plurality of corresponding regions, respectively. For each region, the processing device and/or the control device may compare (e.g., determine a similarity) real-time image information with corresponding preset reference image information. When comparison results of two or more regions satisfy a requirement, the temperature in the chamber may be considered appropriate, and there is no need to adjust the heating parameter.

In some embodiments, the processing device and/or the control device may preset a length of the seed crystal that needs to be melted after the seed crystal contacts the liquid of the raw material. When it is detected that a melting length of the seed crystal satisfies a requirement (e.g., 20-40 minutes after the melting is completed), the processing device and/or the control device may compare the temperature in the chamber again. If the temperature in the chamber is appropriate at this time, the chamber then enters a constant temperature state, and an inoculation of the seed crystal is completed.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the preset range of the weight fluctuation of the seed crystal may be set according to an actual requirement, for example, 0.5 grams, 3 grams, 5 grams, etc. As another example, the real-time image of the seed crystal may be acquired by any image acquisition device.

Figure 12:
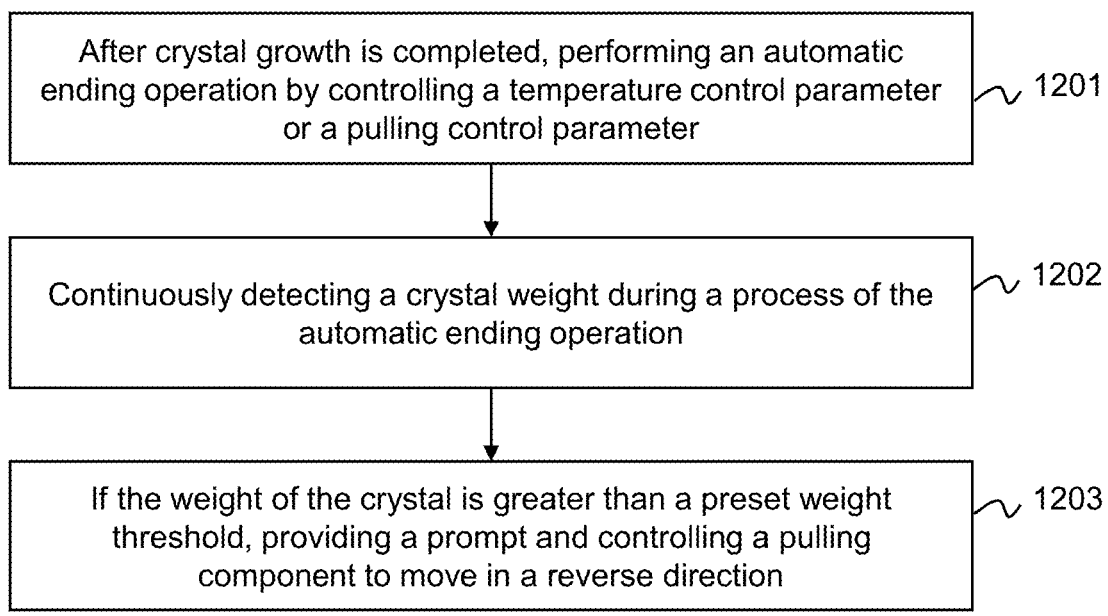
FIG. 12 is a flowchart illustrating an exemplary automatic ending operation according to some embodiments of the present disclosure.

FIG. 12 is a flowchart illustrating an exemplary process of an automatic ending operation according to some embodiments of the present disclosure. In some embodiments, process 1200 may be performed by a processing device (e.g., the processing device 101) and/or a control device (e.g., the control device 102). For example, process 1200 may be stored in a storage device (e.g., a storage device, a storage unit of the processing device and/or the control device) in a form of programs or instructions. When the processor 202 or the modules shown in FIG. 3 execute the programs or instructions, process 1200 may be implemented. In some embodiments, process 1200 may be accomplished with one or more additional operations not described, and/or without one or more of the operations discussed. Additionally, the order of the operations as illustrated in FIG. 12 is not intended to be limiting.

In 1201, after the crystal growth is completed, an automatic ending operation may be performed by controlling a temperature control parameter or a pulling control parameter. In some embodiments, operation 1201 may be executed by the control module 303.

In some embodiments, during the automatic ending operation, the processing device and/or the control device may control an automatic ending of the crystal by controlling the temperature control parameter (e.g., controlling a power or a current of an induction coil) or the pulling control parameter (e.g., controlling a power of a pulling component). Specifically, after the crystal growth is completed, the processing device and/or the control device may control a pulling motor to pull the crystal upward to a preset height at a preset pulling speed, so that a bottom of the crystal is at a certain height (e.g., 5 centimeters, 10 centimeters, 20 centimeters, 30 centimeters) from a liquid level of the raw material. When the crystal is pulled to the preset height, the processing device and/or the control device may control a current or a power of an intermediate frequency power supply to gradually decrease, so that a temperature in the chamber may gradually decrease.

In some embodiments, the preset pulling speed or the preset height may be a system default value or may be adjusted according to different situations. For example, during the pulling process, as the crystal gradually leaves the raw material liquid, a structural stress may appear inside the crystal due to a sudden drop in temperature. The processing device and/or the control device may adjust the preset pulling speed according to the internal structural stress, so as to ensure that the crystal do not crack due to the internal structural stress. For example, the pulling speed may be 1-10 millimeters/hour.

In 1202, a crystal weight may be continuously detected during the automatic ending operation. In some embodiments, operation 1202 may be executed by the control module 303.

In some embodiments, during the pulling process, the processing device and/or the control device may monitor the crystal weight in real time via a weighing component (e.g., the crystal weighing component 105).

In 1203, if the weight of the crystal is greater than a preset weight threshold, a prompt may be provided and a pulling component may be controlled to move in a reverse direction. In some embodiments, operation 1203 may be executed by the control module 303.

During the pulling process, the processing device and/or the control device may continuously monitor the crystal weight. When it is detected that the crystal weight is greater than the preset weight threshold (or a sudden increase in the crystal weight (e.g., the weight difference between a current moment and a previous moment) is greater than a preset weight difference threshold), it may indicate that the crystal is bonded to the wall of the chamber at the current moment. The processing device and/or the control device may provide a prompt and control the pulling component to move in a reverse direction, thereby reducing a tensile force at the bond between the crystal and the chamber, and reducing a chance of crystal cracking.

In some embodiments, the preset weight threshold may be greater than the crystal weight after the crystal is completely separated from the raw material liquid. The preset weight difference threshold may be the maximum weight that the crystal can increase between adjacent moments. In some embodiments, the preset weight threshold and/or the preset weight difference threshold may be system default values or may be adjusted according to different situations. For example, if the weight of the crystal after it is completely separated from the raw material liquid is 20 kilograms, the preset weight threshold may be set as 21 kilograms, 22 kilograms, etc.

In some embodiments, the processing device and/or the control device may control the pulling component (e.g., the pulling motor) to move in a reverse direction until the crystal weight is less than the preset weight threshold. At this time, the crystal may be pulled upward again. When the crystal weight is greater than the preset weight threshold again, the pulling component may be controlled to move in the reverse direction again, and repeated several times, until the crystal weight is continuously less than the preset weight threshold, which may indicate that the crystal is pulled off the wall of the chamber.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 13:
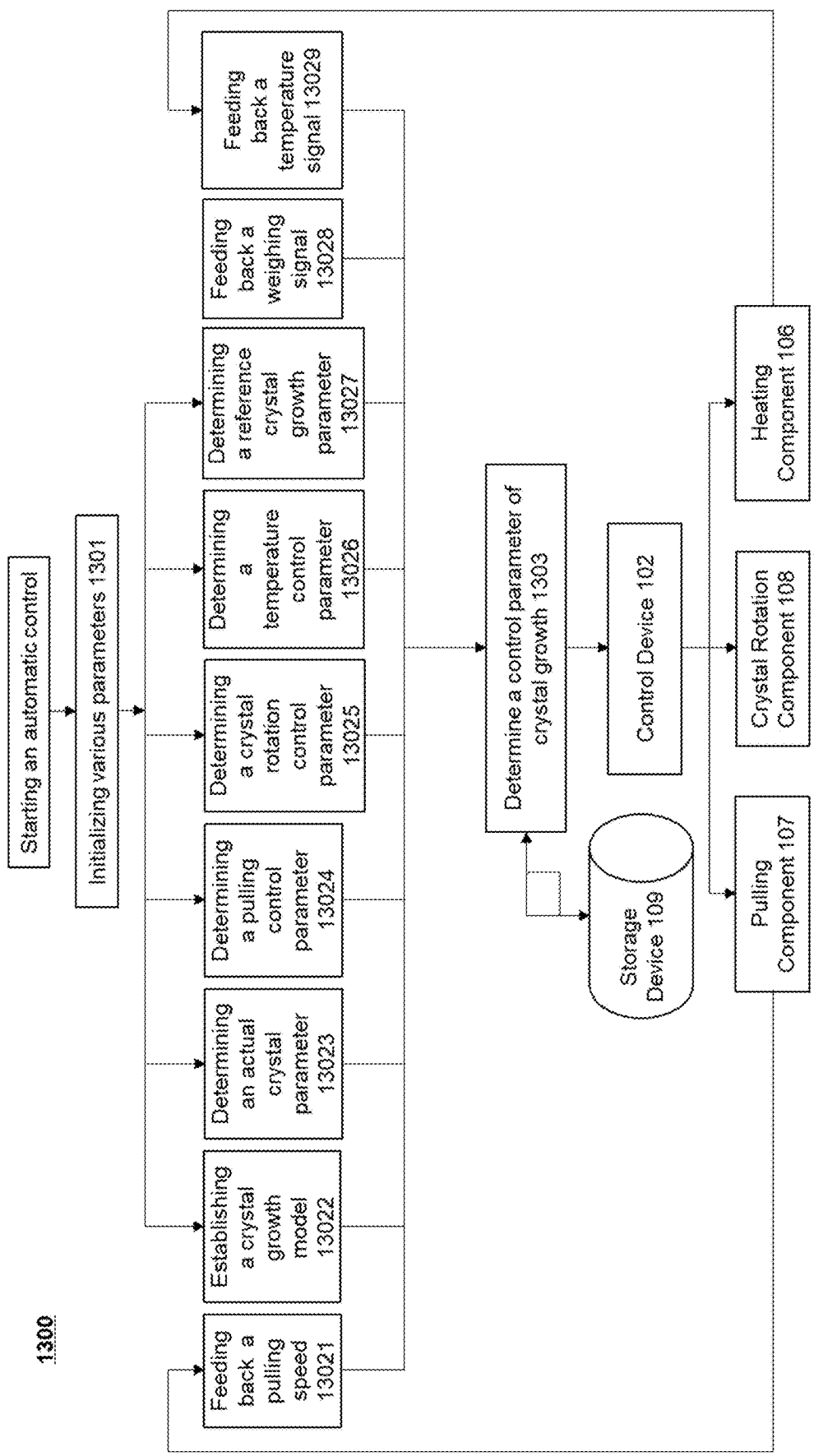
FIG. 13 is a schematic diagram illustrating an exemplary process for controlling crystal growth according to some embodiments of the present disclosure.

FIG. 13 is a schematic diagram illustrating an exemplary process for controlling crystal growth according to some embodiments of the present disclosure.

In a crystal preparation process, after a seed crystal contacts a liquid level of a raw material and is melted, when a weight of the seed crystal is less than a preset weight threshold, a crystal growth stage may be started after the seed crystal keeps stable for a time period. In some embodiments, the processing device and/or the control device may control the crystal growth in an automatic control manner (e.g., start an automatic control).

After the automatic control is started, operation 1301 may be executed to initialize various parameters. The initialization may delete historical data not related to the crystal preparation. After the initialization is completed, the crystal growth control system 100 may execute the following operations:

In 13022, the processing device 101 may establish a crystal growth model. The processing device 101 may also determine a reference crystal parameter and/or a reference crystal growth parameter based on the crystal growth model. More descriptions regarding the crystal growth model may be found in FIGS. 5-7 and the descriptions thereof, which are not repeated here.

In 13023, the processing device 101 may determine an actual crystal parameter. Specifically, the processing device 101 may obtain an actual crystal mass in real time via the crystal weighing component 105. The processing device 101 may also determine an actual crystal height and an actual crystal diameter in each time slice in real time.

In 13024, the processing device 101 may determine a pulling control parameter. More descriptions regarding the pulling control parameter may be found in FIGS. 4-9 and the descriptions thereof, which are not repeated here.

In 13025, the processing device 101 may determine a crystal rotation control parameter. Specifically, the processing device 101 may determine the crystal rotation control parameter corresponding to a specific time slice according to the reference crystal parameter and/or the reference crystal growth parameter corresponding to the specific time slice, and then adjust a crystal rotation speed in a next time slice based on the crystal rotation control parameter.

In 13026, the processing device 101 may determine a temperature control parameter.

In 13027, the processing device 101 may determine a reference crystal growth parameter (e.g., a reference growth coefficient). In some embodiments, operation 13026 may be combined in operation 13022. That is, the processing device 101 may determine the reference crystal growth coefficient based on the crystal growth model. In some embodiments, the processing device 101 may also determine the reference crystal growth coefficient separately, that is, it is unnecessary to determine the reference crystal growth coefficient through the crystal growth model. More descriptions regarding the reference crystal growth parameter may be found in FIGS. 4-7 and the descriptions thereof, which are not repeated here.

In 13021, the pulling component 107 may feedback a current speed to the processing device 101. In some embodiments, the processing device 101 may read a pulling height of the crystal via a grating ruler, or determine the pulling height according to a rotation speed of the pulling motor, and then determine a pulling speed.

In 13028, the crystal weighing component 105 may feedback a weighing signal to the processing device 101. The processing device 101 may determine the actual crystal mass based on the weighing signal. In some embodiments, operation 13027 may be combined in operation 13023. That is, the processing device 101 may determine the actual crystal parameter based on the weighing signal.

In 13029, the heating component 106 may feedback a current temperature signal to the processing device 101. The processing device 101 may determine a temperature value based on the temperature signal.

In 1303, the processing device 101 may determine a control parameter of crystal growth (e.g., a pulling control parameter, a crystal rotation control parameter, a temperature control parameter) based on the relevant data of the above operations 13021 to 13029. Further, the processing device 101 may transmit various control parameters to the control device 102. The control device 102 may control a subsequent process. Specifically, the control device 102 may control a pulling process of the pulling component 107 based on the pulling control parameter. The control device 102 may control a heating process of the heating component 106 based on the temperature control parameter. The control device 102 may control a crystal rotation process of the crystal rotation component 108 based on the crystal rotation control parameter.

Figure 14:
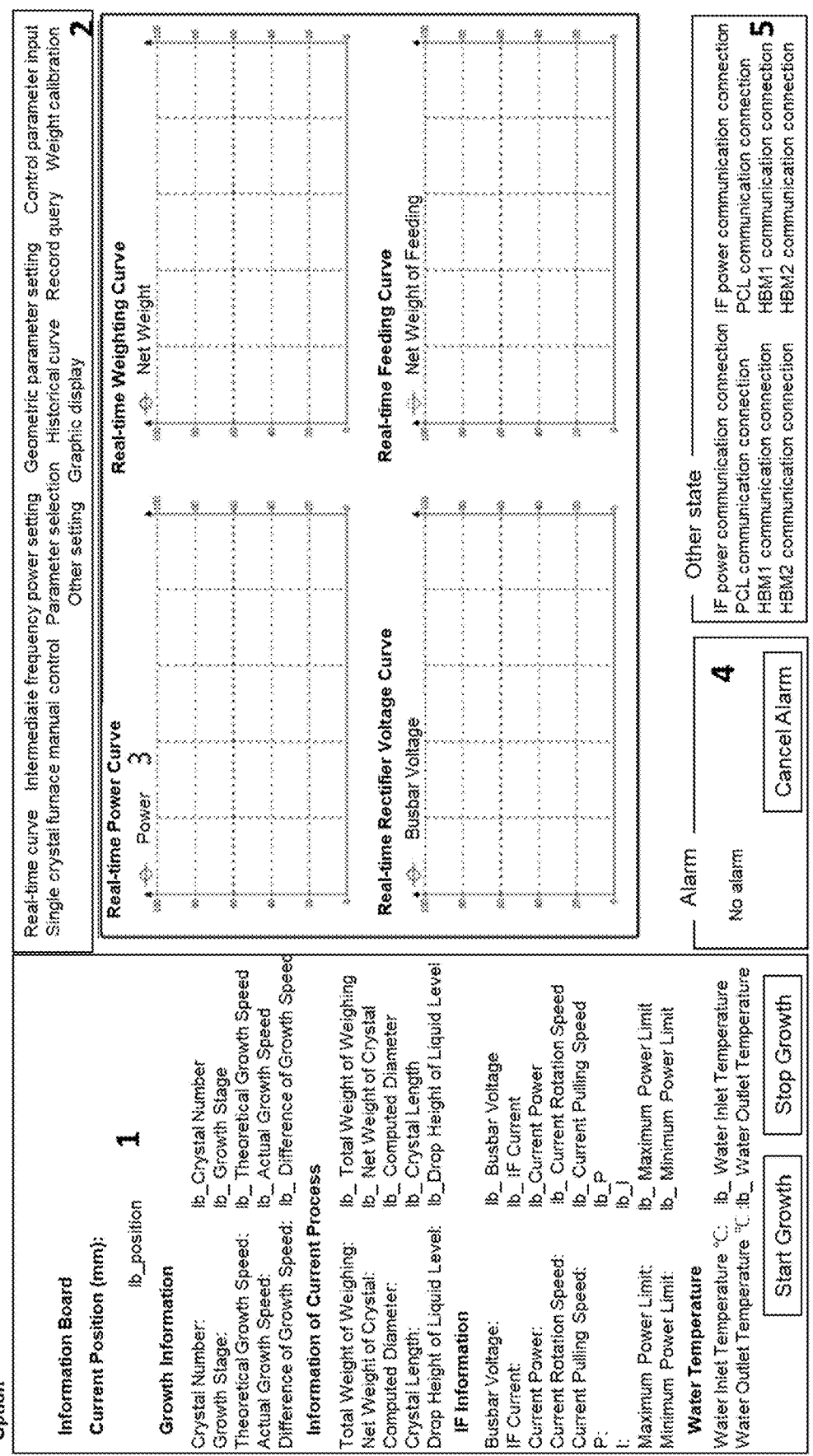
FIG. 14 is an exemplary operation interface of an exemplary crystal growth control system according to some embodiments of the present disclosure.

FIG. 14 is an exemplary operation interface illustrating an exemplary crystal growth control system according to some embodiments of the present disclosure.

As shown in FIG. 14, an operation interface 1400 may be divided into 5 major functional areas: (1) a crystal growth information display area (located on a left side of the operation interface 1400) used to observe real-time data of a crystal growth process, such as a growth stage, a crystal weight, information of an intermediate frequency power supply, etc.; (2) a functional module switching button area (located at a top of the operation interface 1400) used to switch between various sub-functional modules (e.g., a real-time curve, an intermediate frequency power setting, a record query, etc.); (3) a sub-function module display area (located in a middle of the operation interface 1400) used to display contents of each sub-function module; (4) an alarm area (located in a lower middle part of the operation interface 1400) used to display an alarm content of a current system and prompt an operator to perform a corresponding processing for the alarm; (5) a communication status display area (located on a lower right part of the operation interface 1400) used to display a communication status of a device or a module in real time, for example, an intermediate frequency power communication connection, a PCL communication connection, etc.

It should be noted that the above description of the process is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the operation interface may also include other functional areas, such as a crystal real-time shape area.

Figure 15:
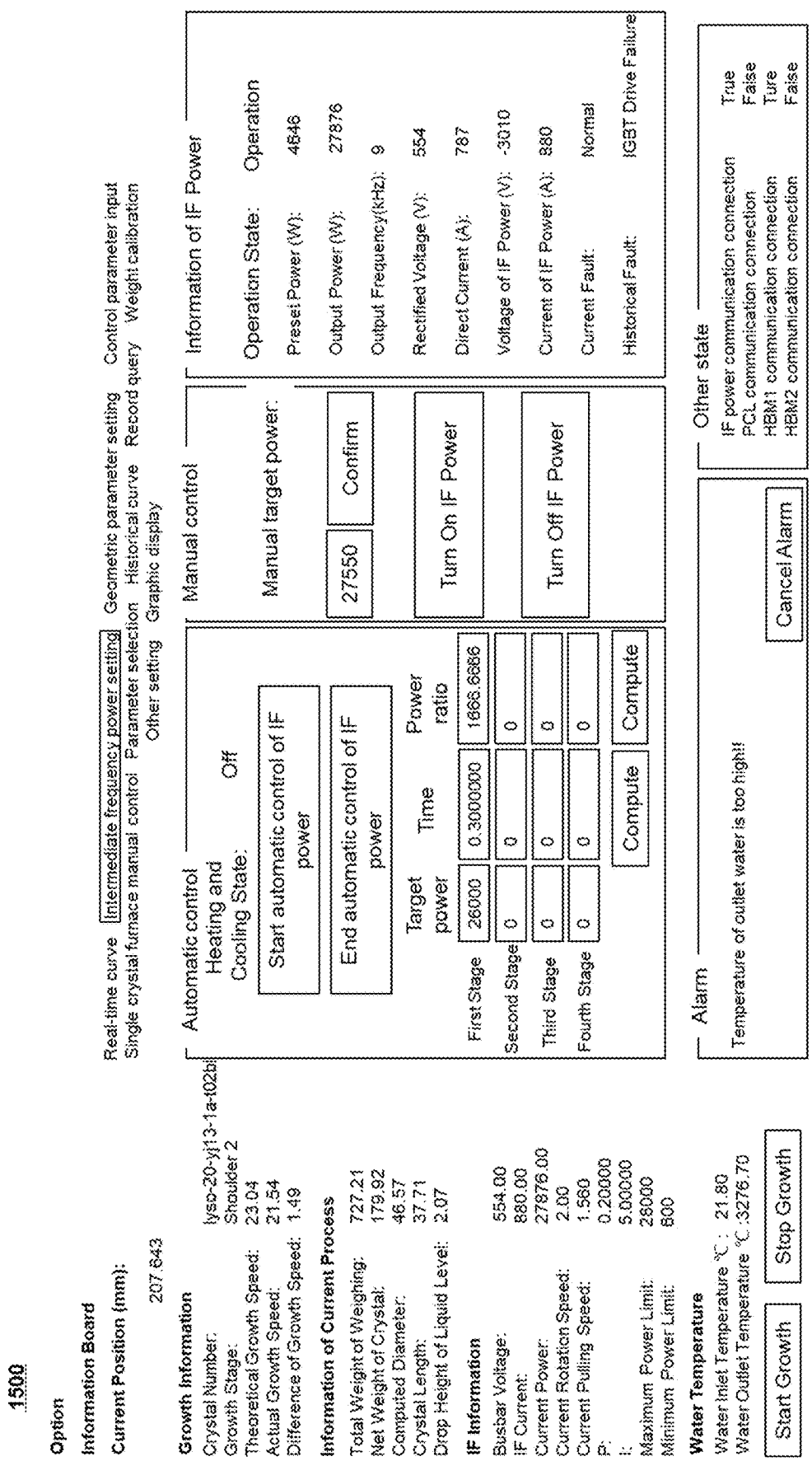
FIG. 15 is an exemplary operation interface for an intermediate frequency power control according to some embodiments of the present disclosure.

FIG. 15 is an exemplary operation interface for an intermediate frequency power control according to some embodiments of the present disclosure.

Referring to FIG. 5 and FIG. 8, the processing device and/or control device may adjust a temperature in any time slice based on a temperature control parameter. For example, the processing device and/or control device may adjust a parameter of a heating component (e.g., an intermediate frequency power supply, an induction coil) based on the temperature control parameter via an automatic control. As shown in FIG. 15, an operation interface 1500 may display a specific control condition of the intermediate frequency power supply, for example, a target power, time, a power ratio, etc. In some embodiments, the automatic control may be used in a middle stage and a late stage of the crystal growth (e.g., a shouldering stage, an equal diameter stage, an ending stage).

In some embodiments, a parameter of the intermediate frequency power supply may also be controlled via a manual control manner. The manual control may be used in an early stage of the crystal growth (e.g., a process of dropping a seed crystal, a process of heating a chamber). For example, as shown in FIG. 15, the intermediate frequency power supply may be switched by pressing buttons "turn on intermediate frequency power" and "turn off intermediate frequency power." The operation interface 1500 may also display specific information of the intermediate frequency power supply, such as an operating status, a setting power, an output power, etc.

Figure 16:
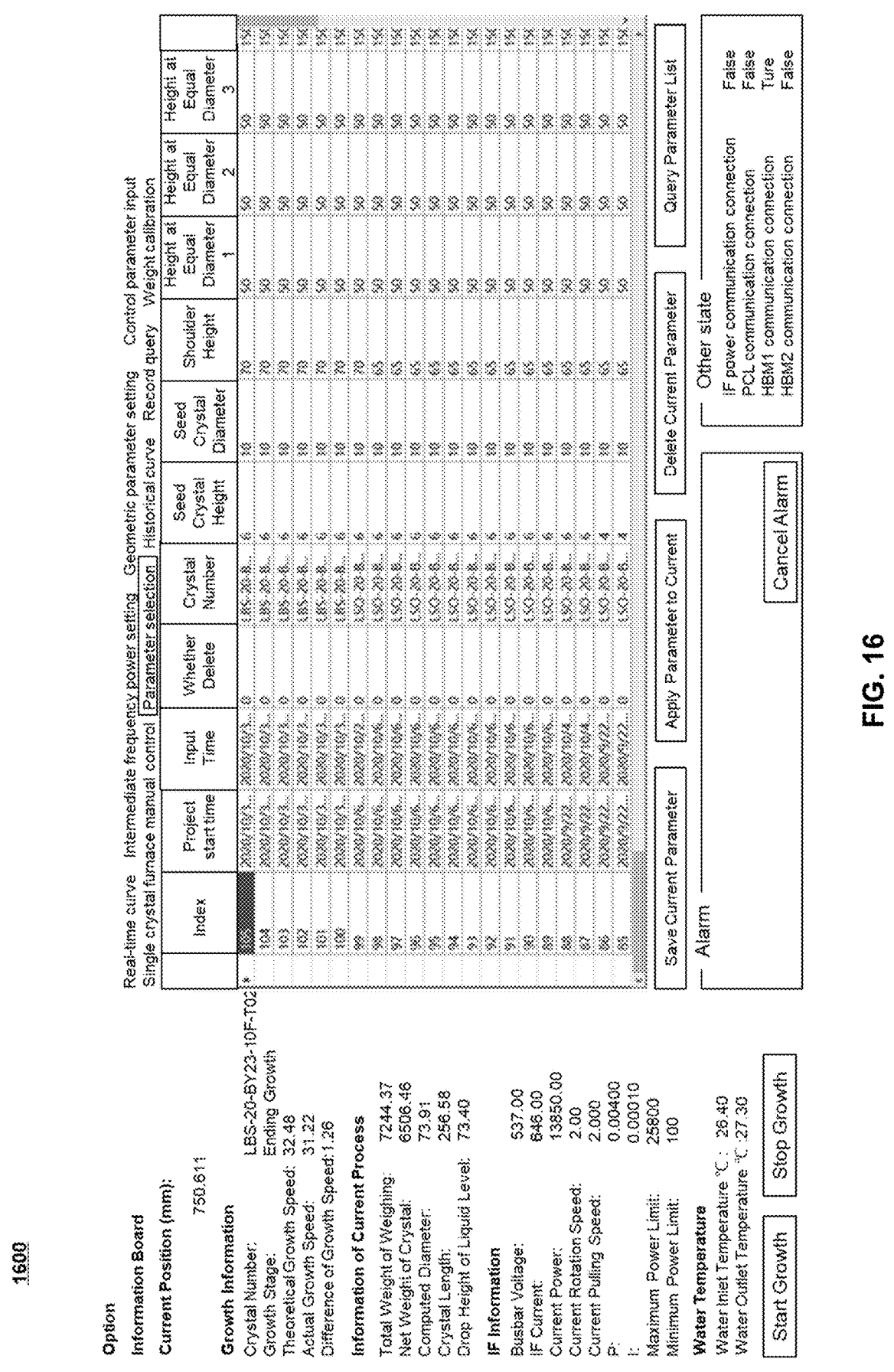

FIG. 16 is an exemplary operation interface for a parameter selection according to some embodiments of the present disclosure.

In some embodiments, the crystal growth control system 100 may have a parameter selection function. As shown in FIG. 16, a user may query, via an operation interface 1600, parameters that have been run, for example, an actual crystal growth parameter (e.g., a crystal growth temperature, a pulling speed, a crystal rotation speed), a reference crystal parameter (e.g., a reference crystal mass, a reference crystal diameter, a reference crystal height), a reference crystal growth parameter (e.g., a reference growth coefficient, a reference pulling speed). Further, the user may also select a parameter via the operation interface 1600. After the parameter is selected, the selected parameter may be saved (i.e., "save current parameter"), the selected parameter may be applied to a current crystal growth process (i.e., "apply parameter to current process"), the selected parameter may be deleted (i.e., "delete current parameter"), or details of the selected parameter may be queried (i.e., "query parameter list"), or the like.

Figure 17:
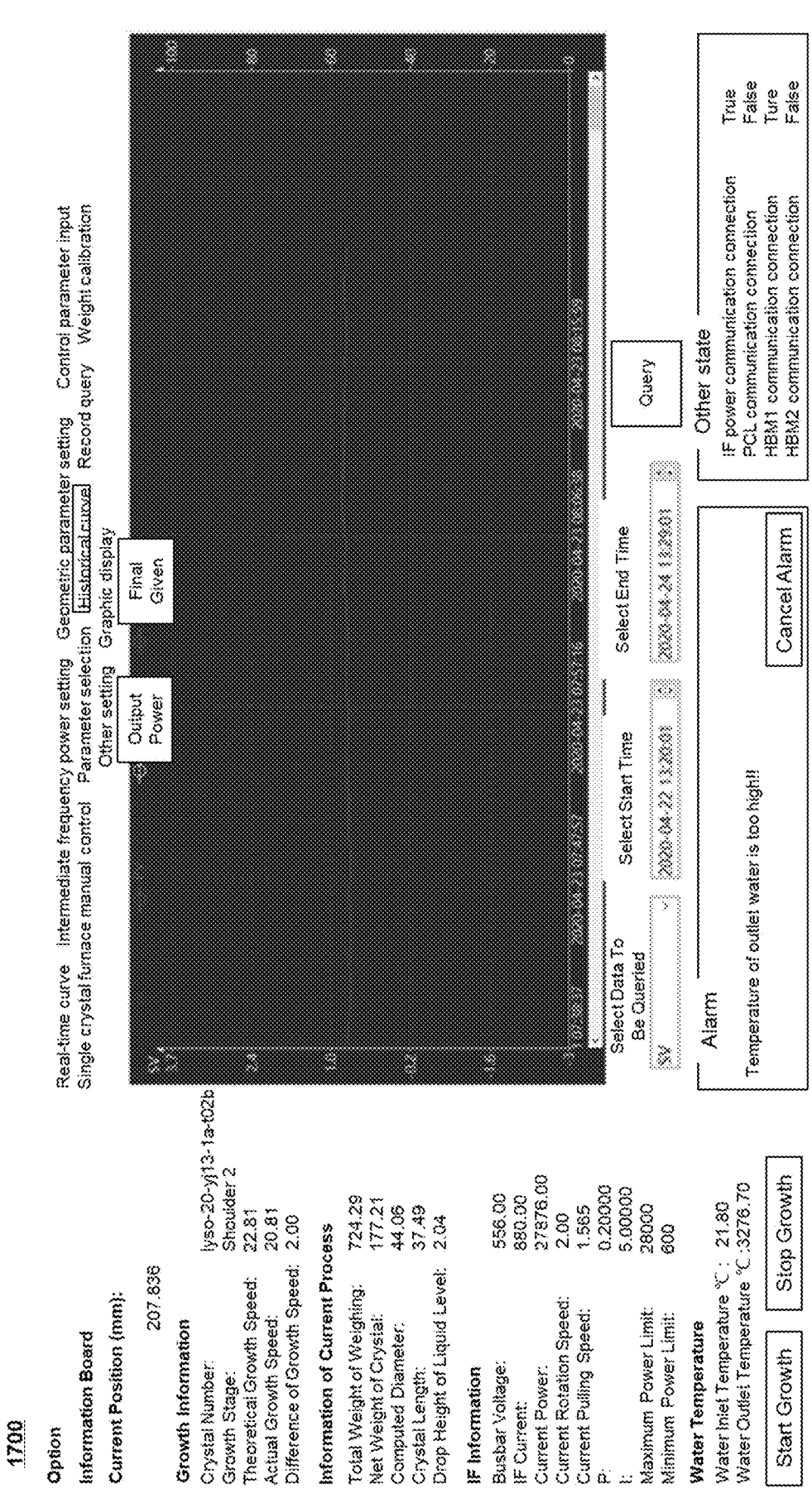
FIG. 17 is an exemplary operation interface for a historical curve query according to some embodiments of the present disclosure.

FIG. 17 is an exemplary operation interface for a historical curve query according to some embodiments of the present disclosure.

In some embodiments, the crystal growth control system 100 may have a historical curve query function. As shown in FIG. 17, an operation interface 1700 may display a historical curve. The horizontal axis represents time and the vertical axis represents historical target data. In some embodiments, the historical target data may be crystal growth data (e.g., an actual crystal height, an actual crystal diameter, a growth speed, a growth stage, an actual crystal mass), a control parameter (e.g., a crystal rotation speed, a pulling speed, a temperature), etc. As shown in FIG. 17, a user may input a time period to be queried (i.e., "select start time" and "select end time") via the operation interface 1700, input historical target data to be queried (i.e., "select data to be queried"), and click a "query" button to query the historical target data in the time period. A display area of the operation interface 1700 may display a historical curve of the historical target data within the time period. The user can intuitively view a data trend and then determine a growth status of the crystal. Further, the user may query a plurality of types of historical target data in the same time period simultaneously. For example, the user may input the actual crystal diameter, the actual crystal height, and the pulling speed in the operation interface 1700 simultaneously. The display area may display historical curves of the above three parameters simultaneously, which may be easy for the user to view.

Figure 18:
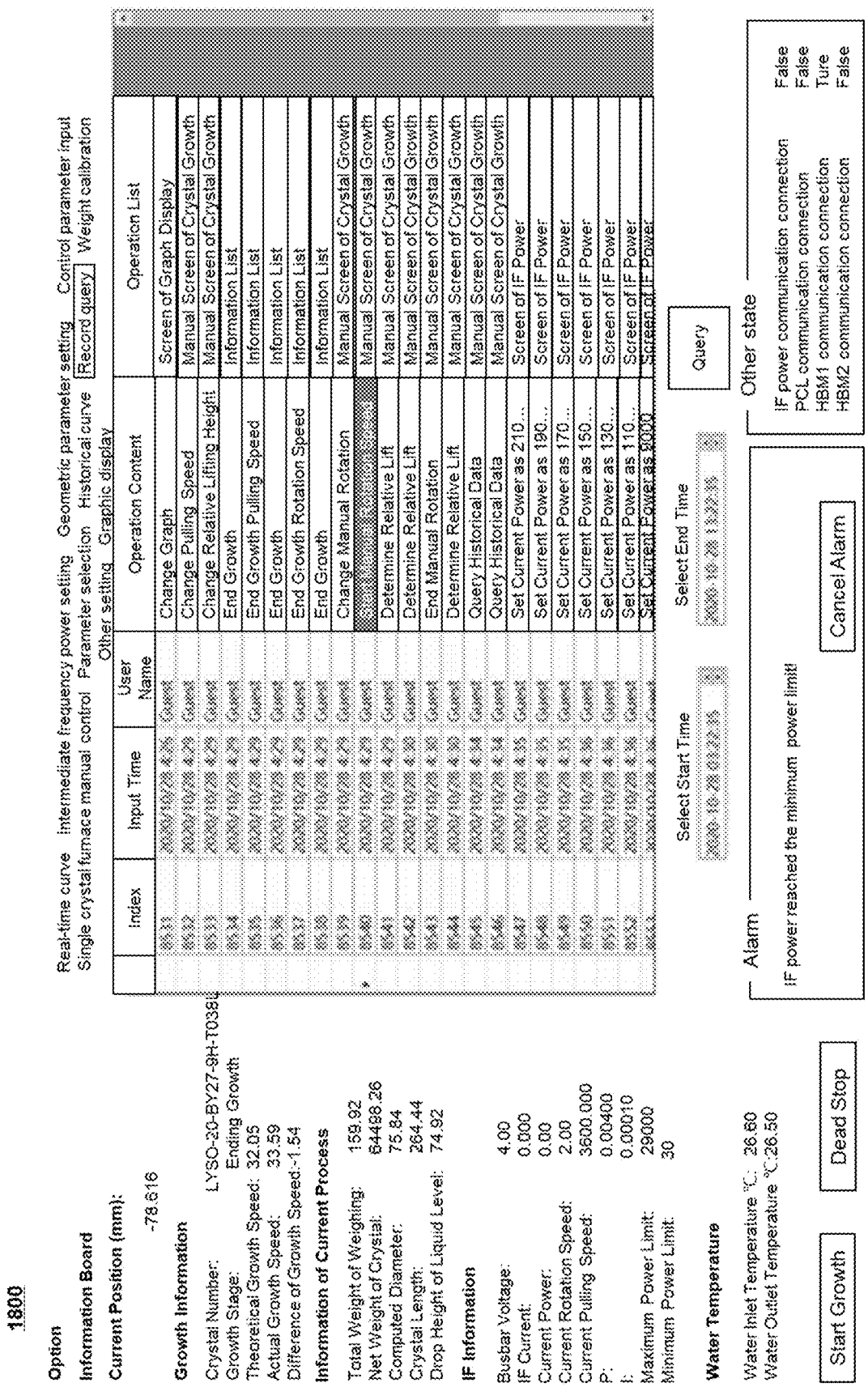
FIG. 18 is an exemplary operation interface for an operation record query according to some embodiments of the present disclosure.

FIG. 18 is an exemplary operation interface for an operation record query according to some embodiments of the present disclosure.

In some embodiments, the crystal growth control system 100 may have an operation record query function. As shown in FIG. 18, a user may input a time period to be queried (i.e., "select start time" and "select end time") via an operation interface 1800. Then, operation records in the time period may be queried and displayed in a table on the operation interface 1800.

Figure 19:
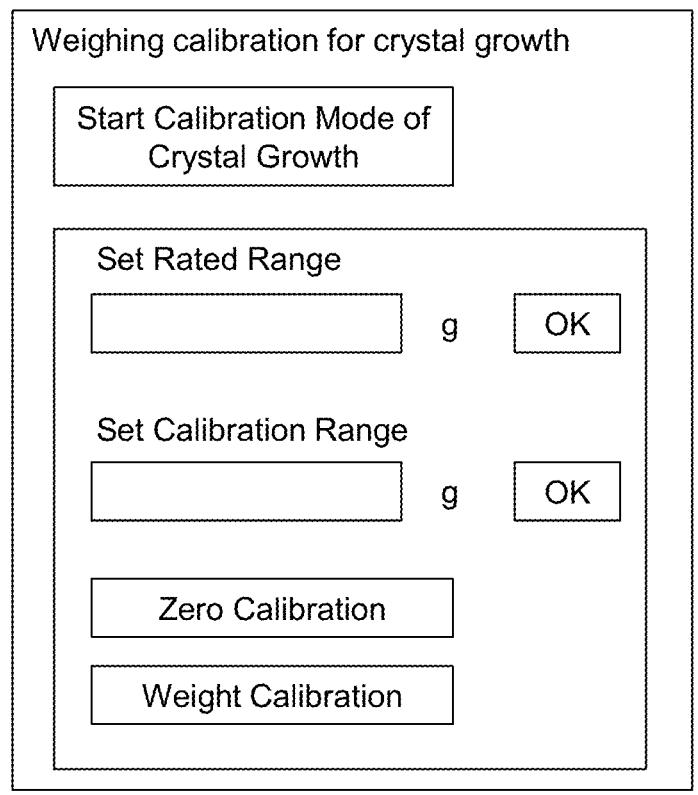
FIG. 19 is an exemplary operation interface for a weighing calibration according to some embodiments of the present disclosure.

FIG. 19 is an exemplary operation interface for a weighing calibration according to some embodiments of the present disclosure.

In some embodiments, the crystal growth control system 100 may have a weighing calibration function. In some cases, a weighing component (e.g., the feeding and weighing component 104, the crystal weighing component 105) may have certain errors after a time period of use and need to be calibrated, or after the weighing component is replaced, the weighing component may also need to be calibrated. In some embodiments, as shown in FIG. 19, a zero calibration operation and a weight calibration operation may be performed on the weighing component. A zero setting may be performed on the weighing component through the zero calibration. An accuracy of the weighing component may be adjusted through the weight calibration operation. As shown in FIG. 19, a user may click a button "zero calibration," input a rated range and a calibration range, and click a button "weight calibration" on the operation interface 1900, to calibrate the weighing component (i.e., "start calibration mode of crystal growth"). Specifically, when the weighing component is not executing a weighting operation, the weighing component may be reset to zero by clicking the button "zero calibration;" a maximum range of the weighing component may be input in "set rated range" and a button "OK" may be clicked to set; subsequently, a standard weight may be placed on the weighing component, a weight of the standard weight may be input in "set calibration range," and the button "OK" may be clicked to set; finally, the button "weight calibration" may be clicked. The processing device 101 may send the calibration range to the weighing component and calibrate the weighing component according to a value (e.g., the weight of the standard weight) obtained from the weighing component. In some embodiments, the weighting component may be calibrated by a plurality of standard weights with different weights. In some embodiments, the zero calibration, the rated range, the calibration range, and deformation data of the weighing component input during the calibration process may be stored in the corresponding weighing component.

It should be noted that the above description of the process is merely provided for the purposes of illustration, and not intended to limit the scope of the present disclosure. For persons having ordinary skills in the art, multiple variations and modifications in form and detail to the implementation of the above processes and systems, devices, and equipment may be made under the teachings of the present disclosure. However, those variations and modifications do not depart from the scope of the present disclosure.

The possible beneficial effects of the embodiments of the present disclosure may include but not be limited to the following:

(1) An actual crystal parameter may be obtained during a crystal growth process in real time. A temperature control parameter and a pulling control parameter may be adjusted according to a difference between the actual crystal parameter and a reference crystal parameter. Therefore, the crystal growth process may be controlled accurately and the quality of a prepared crystal may be improved.

(2) By dividing the crystal growth control process into a plurality of time slices and performing a gradual control among the time slices, the crystal growth process may be controlled accurately and the actual crystal may be consistent with a crystal growth model.

(3) By continuously detecting a weight of a seed crystal during a process of dropping the seed crystal and detecting a crystal weight during an automatic ending operation and controlling a pulling component to move in a reverse direction, the collision and adhesion between the seed crystal and a chamber may be effectively avoided, and a stability of the crystal growth control process may be improved.

It should be noted that different embodiments may have different beneficial effects. In different embodiments, possible beneficial effects may be any of the above effects, any combination thereof, or any other beneficial effects that may be obtained.

The above content describes this disclosure and/or some other examples. Based on the above content, this disclosure may also be modified in different ways. The subject matter disclosed in this disclosure can be implemented in different forms and examples, and this disclosure can be applied to a large number of applications. All applications, modifications and changes claimed in the following claims belong to the scope of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. In addition, certain features, structures, or characteristics in one or more embodiments of the present disclosure may be appropriately combined.

Those skilled in the art may understand that the content disclosed in the present disclosure may have many variations and improvements. For example, the different system components described above may all be realized by hardware devices, but they may also be realized only by software solutions. For example, the system may be installed on an existing server. In addition, location information disclosed herein may be provided through a firmware, a combination of firmware/software, a combination of firmware/hardware, or a combination of hardware/firmware/software.

All software or part of the software may sometimes communicate through a network, such as the Internet or other communication networks. This type of communication may load software from one computer device or processor to another. For example, a hardware platform may be loaded from a management server or host computer of a crystal growth control system to a computer environment, or other computer environment for realizing the system. Therefore, another medium that can transmit software elements may also be used as a physical connection between local devices, such as light waves, electric waves, electromagnetic waves, etc., through cables, optical cables, or air. The physical medium used for carrier waves, such as cables, wireless connections, or optical cables, may also be considered as the medium that carry software. Unless the usage herein limits the tangible "storage" medium, other terms referring to the computer or machine "readable medium" all refer to the medium that participates in the process of executing any instructions by the processor.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (e.g., through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installing on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of a count of reported significant digits and by applying ordinary rounding techniques. Notwithstanding that the numerical ranges and parameters configured to illustrate the broad scope of some embodiments of the present disclosure are approximations, the numerical values in specific examples may be as accurate as possible within a practical scope.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, or any of same that may have a limiting affect as to the broadest scope of the claims now or later associated with the present document. It should be noted that if the description, definition, and/or terms used in the appended application of the present disclosure is inconsistent or conflicting with the content described in the present disclosure, the use of the description, definition and/or terms of the present disclosure shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present disclosure are not limited to that precisely as shown and described.

What is claimed is:

1. A method for controlling crystal growth, comprising:
obtaining an actual crystal parameter in a target time slice, wherein the actual crystal parameter includes at least one of an actual crystal mass, an actual crystal diameter, an actual crystal height, or an actual crystal shape;
obtaining a reference crystal parameter in the target time slice, wherein the reference crystal parameter includes at least one of a reference crystal mass, a reference crystal diameter, a reference crystal height, or a reference crystal shape, wherein the obtaining a reference crystal parameter in the target time slice comprises:
constructing a crystal growth model based on a preset crystal parameter and a preset crystal growth parameter, and at least one of parameters involved in a crystal growth process including an internal stress, an internal defect, an internal component distribution, a continuity of different crystal growth stages, wherein the crystal growth model characterizes a theoretical growth condition of the crystal in an entire growth process; and
determining the reference crystal parameter corresponding to the target time slice based on the crystal growth model;
determining a temperature control parameter based on the actual crystal parameter and the reference crystal parameter;
determining a pulling control parameter based on the actual crystal parameter and the reference crystal parameter; and
adjusting a temperature and a pulling speed in a next time slice after the target time slice respectively based on the temperature control parameter and the pulling control parameter;
wherein the method further comprises:
obtaining a real-time image during a process of dropping the seed crystal;
comparing the real-time image with a preset reference image, including:
dividing the preset reference image and the real-time image into a plurality of corresponding regions, respectively;
for each region, comparing real-time image information with corresponding preset reference image information to determine a similarity, the image information including at least one of a size of a meniscus, a brightness of the meniscus, a size of a meniscus aperture, or a flow range of a flow line of a raw material liquid;
in response to that the similarity is greater than a preset similarity threshold, determining that there is no need to adjust the heating parameter; and
in response to that the similarity is less than or equal to the preset similarity threshold, adjusting the heating parameter.

2. The method of claim 1, wherein the obtaining an actual crystal parameter in a target time slice comprises:
determining a drop height of a liquid level in the target time slice based on the actual crystal mass, a density of a raw material under a molten state, and a size of a chamber;
determining the actual crystal height based on a pulling height and the drop height of the liquid level in the target time slice; and
determining the actual crystal diameter based on the actual crystal mass and the actual crystal height.

3. The method of claim 1, wherein the preset crystal parameter includes at least one of a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, or a ratio of a transition angel between the seed crystal and a shoulder front end to a transition angel between a shoulder end and a front end at the equal diameter.

4. The method of claim 1, wherein the preset crystal growth parameter includes at least one of a preset crystal growth speed or a preset growth coefficient.

5. The method of claim 1, wherein the constructing a crystal growth model based on the at least one of the preset crystal parameter or the preset crystal growth parameter comprises:
constructing the crystal growth model based on the at least one of the preset crystal parameter or the preset crystal growth parameter according to a three-dimensional modeling method.

6. The method of claim 1, wherein the determining a temperature control parameter based on the actual crystal parameter and the reference crystal parameter comprises:
determining a difference between the actual crystal parameter and the reference crystal parameter; and
determining the temperature control parameter based on the difference and a reference crystal growth parameter.

7. The method of claim 1, wherein the determining a pulling control parameter based on the actual crystal parameter and the reference crystal parameter comprises:
determining a drop speed of a liquid level in the target time slice based on the actual crystal mass, a melting density of a raw material, and a size of a chamber; and
determining the pulling control parameter based on the drop speed of the liquid level and a reference crystal growth parameter.

8. The method of claim 1, wherein before the obtaining an actual crystal parameter in a target time slice, the method further comprises:
heating a chamber to a preset temperature; and
in response to detecting that a temperature in the chamber is stable at the preset temperature for a preset time, automatically dropping a seed crystal.

9. The method of claim 8, wherein the method further comprises:
continuously detecting a weight of the seed crystal during a process of automatically dropping the seed crystal; and
if the weight of the seed crystal is less than a preset weight threshold or a weight difference between a current moment and a previous moment is greater than a preset weight difference threshold, determining that the seed crystal hits a wall of a chamber at the current moment; and
stopping dropping the seed crystal and providing a prompt,
wherein the preset weight threshold is a minimum weight of the seed crystal after the seed crystal contacts a liquid level of a raw material and is melted, and the preset weight difference threshold is a maximum weight that the seed crystal can reduce between adjacent moments, and
the preset weight threshold is 0.8 times or 0.7 times the weight of the seed crystal.

10. The method of claim 1, wherein the method further comprises:

after the crystal growth is completed, performing an automatic ending operation by controlling the temperature control parameter or the pulling control parameter.

11. The method of claim 10, wherein the method further comprises:
continuously detecting a crystal weight during the automatic ending operation; and
if the crystal weight is greater than a preset weight threshold or a weight difference between a current moment and a previous moment is greater than a preset weight difference threshold, determining that the crystal is bonded to a wall of a chamber at the current moment, and
providing a prompt and controlling a pulling component to move in a reverse direction,
wherein the preset weight threshold is greater than the crystal weight after a crystal is completely separated from a raw material liquid, and the preset weight difference threshold is a maximum weight that the crystal can increase between adjacent moments.

12. The method of claim 11, the method further comprises:
controlling the pulling component to move in a reverse direction until the crystal weight is less than the preset weight threshold;
controlling the pulling component to move upward again; and
repeated one or more times until the crystal weight is continuously less than the preset weight threshold.

13. A system for controlling crystal growth, comprising:
at least one storage storing computer instructions;
at least one processor in communication with the at least one storage, when executing the computer instructions, the at least one processor causes the system to:
obtain an actual crystal parameter in a target time slice, wherein the actual crystal parameter includes at least one of an actual crystal mass, an actual crystal diameter, an actual crystal height, or an actual crystal shape;
obtain a reference crystal parameter in the target time slice, wherein the reference crystal parameter includes at least one of a reference crystal mass, a reference crystal diameter, a reference crystal height, or a reference crystal shape, and wherein to obtain the reference crystal parameter in the target time slice, the at least one processor causes the system to:
construct a crystal growth model based on a preset crystal parameter and a preset crystal growth parameter, and at least one of parameters involved in a crystal growth process including an internal stress, an internal defect, an internal component distribution, a continuity of different crystal growth stages, wherein the crystal growth model characterizes a theoretical growth condition of the crystal in an entire growth process; and
determine the reference crystal parameter corresponding to the target time slice based on the crystal growth model;
determine a temperature control parameter based on the actual crystal parameter and the reference crystal parameter;
determine a pulling control parameter based on the actual crystal parameter and the reference crystal parameter; and
adjust a temperature and a pulling speed in a next time slice after the target time slice respectively based on the temperature control parameter and the pulling control parameter;
wherein the at least one processor further causes the system to:
obtain a real-time image during a process of dropping the seed crystal;
compare the real-time image with a preset reference image, including:
divide the preset reference image and the real-time image into a plurality of corresponding regions, respectively;
for each region, compare real-time image information with corresponding preset reference image information to determine a similarity, the image information including at least one of a size of a meniscus, a brightness of the meniscus, a size of a meniscus aperture, or a flow range of a flow line of a raw material liquid;
in response to that the similarity is greater than a preset similarity threshold, determine that there is no need to adjust the heating parameter; and
in response to that the similarity is less than or equal to the preset similarity threshold, adjust the heating parameter.

14. The system of claim 13, wherein to obtain an actual crystal parameter in a target time slice, the at least one processor causes the system to:
determine a drop height of a liquid level in the target time slice based on the actual crystal mass, a density of a raw material under a molten state, and a size of a chamber;
determine the actual crystal height based on a pulling height and the drop height of the liquid level in the target time slice; and
determine the actual crystal diameter based on the actual crystal mass and the actual crystal height.

15. The system of claim 13, wherein the preset crystal parameter includes at least one of a crystal type, a preset crystal density, a preset crystal mass, a preset seed crystal height, a preset seed crystal diameter, a preset shoulder height, a preset height at an equal diameter, a preset diameter at the equal diameter, a preset tail height, a preset crystal tail height, a preset crystal tail diameter, a preset shoulder angle, a preset tail angle, or a ratio of a transition angel between the seed crystal and a shoulder front end to a transition angel between a shoulder end and a front end at the equal diameter.

16. The system of claim 13, wherein the preset crystal growth parameter includes at least one of a preset crystal growth speed or a preset growth coefficient.

17. The system of claim 13, wherein to construct a crystal growth model based on the at least one of the preset crystal parameter or the preset crystal growth parameter, the at least one processor causes the system to:
construct the crystal growth model based on the at least one of the preset crystal parameter or the preset crystal growth parameter according to a three-dimensional modeling method.

18. A computer-readable storage medium, wherein the storage medium stores computer instructions, the instructions, when executed by at least one processor, causing the at least one processor to perform operations including:
obtaining an actual crystal parameter in a target time slice, wherein the actual crystal parameter includes at least one of an actual crystal mass, an actual crystal diameter, an actual crystal height, or an actual crystal shape;

obtaining a reference crystal parameter in the target time slice, wherein the reference crystal parameter includes at least one of a reference crystal mass, a reference crystal diameter, a reference crystal height, or a reference crystal shape, wherein the obtaining a reference crystal parameter in the target time slice comprises:
  constructing a crystal growth model based on a preset crystal parameter and a preset crystal growth parameter, and at least one of parameters involved in a crystal growth process including an internal stress, an internal defect, an internal component distribution, a continuity of different crystal growth stages, wherein the crystal growth model characterizes a theoretical growth condition of the crystal in an entire growth process; and
  determining the reference crystal parameter corresponding to the target time slice based on the crystal growth model;
determining a temperature control parameter based on the actual crystal parameter and the reference crystal parameter;
determining a pulling control parameter based on the actual crystal parameter and the reference crystal parameter; and
adjusting a temperature and a pulling speed in a next time slice after the target time slice respectively based on the temperature control parameter and the pulling control parameter;

wherein the instructions, when executed by at least one processor, causing the at least one processor to perform further operations including:

obtaining a real-time image during a process of dropping the seed crystal;

comparing the real-time image with a preset reference image, including:
  dividing the preset reference image and the real-time image into a plurality of corresponding regions, respectively;
  for each region, comparing real-time image information with corresponding preset reference image information to determine a similarity, the image information including at least one of a size of a meniscus, a brightness of the meniscus, a size of a meniscus aperture, or a flow range of a flow line of a raw material liquid;

in response to that the similarity is greater than a preset similarity threshold, determining that there is no need to adjust the heating parameter; and in response to that the similarity is less than or equal to the preset similarity threshold, adjusting the heating parameter.

\* \* \* \* \*